(12) United States Patent
Su et al.

(10) Patent No.: US 10,263,070 B2
(45) Date of Patent: Apr. 16, 2019

(54) METHOD OF MANUFACTURING LV/MV SUPER JUNCTION TRENCH POWER MOSFETS

(71) Applicant: Alpha and Omega Semiconductor (Cayman) Ltd., Grand Cayman (KY)

(72) Inventors: Yi Su, Cupertino, CA (US); Sik Lui, Sunnyvale, CA (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 49 days.

(21) Appl. No.: 15/620,717

(22) Filed: Jun. 12, 2017

(65) Prior Publication Data

US 2018/0358433 A1 Dec. 13, 2018

(51) Int. Cl.
| | |
|---|---|
| *H01L 29/06* | (2006.01) |
| *H01L 29/40* | (2006.01) |
| *H01L 29/78* | (2006.01) |
| *H01L 29/10* | (2006.01) |
| *H01L 29/423* | (2006.01) |
| *H01L 29/66* | (2006.01) |

(Continued)

(52) U.S. Cl.
CPC ........ *H01L 29/0634* (2013.01); *H01L 21/266* (2013.01); *H01L 21/26513* (2013.01); *H01L 29/0623* (2013.01); *H01L 29/0696* (2013.01); *H01L 29/1095* (2013.01); *H01L 29/4236* (2013.01); *H01L 29/66734* (2013.01); *H01L 29/7811* (2013.01); *H01L 29/7813* (2013.01)

(58) Field of Classification Search
CPC .......... H01L 29/0634; H01L 29/66734; H01L 29/7811; H01L 29/4236
See application file for complete search history.

(56) References Cited

U.S. PATENT DOCUMENTS

| | | |
|---|---|---|
| 6,300,171 B1 | 10/2001 | Frisina |
| 6,611,021 B1 | 8/2003 | Onishi et al. |

(Continued)

OTHER PUBLICATIONS

Onishi, Y.; Iwamoto, S.; Sato, T.; Nagaoka, T.; Ueno, K.; Fujihira, T., "24 m.OMEGA.cm2 680 V silicon superjunction MOSFET", Proceedings of the 14th International Symposium on Power Semiconductor Devices and ICs, 2002, pp. 241-244.

(Continued)

*Primary Examiner* — Changhyun Yi
(74) *Attorney, Agent, or Firm* — JDI Patent; Joshua D. Isenberg; Robert A. Pullman

(57) ABSTRACT

Aspects of the present disclosure disclose a superjunction trench MOSFET device for low voltage or medium voltage devices and a method of fabricating the same. The superjunction trench MOSFET device according to aspects of the present disclosure comprises an active cell region and a termination region disposed at an outer periphery of the active cell region. The active cell region comprises an array of device cells with the superjunction structure. The termination region may comprise a termination structure. In one embodiment, the termination structure includes guard rings in an intrinsic epitaxial layer. In one embodiment, the termination structure includes an array of floating P columns. In another embodiment, the termination structure includes an array of floating P columns and floating termination trenches.

31 Claims, 23 Drawing Sheets

(51) Int. Cl.
*H01L 21/265* (2006.01)
*H01L 21/266* (2006.01)

(56) References Cited

U.S. PATENT DOCUMENTS

| | | |
|---|---|---|
| 6,979,862 B2 | 12/2005 | Henson |
| 8,466,510 B2 | 6/2013 | Guan et al. |
| 8,476,698 B2 | 7/2013 | Guan et al. |
| 8,575,690 B1 | 11/2013 | Hsieh |
| 8,772,868 B2 | 7/2014 | Yedinak et al. |
| 8,900,949 B2 | 12/2014 | Guan et al. |
| 2002/0066924 A1 | 6/2002 | Blanchard |
| 2006/0043480 A1 | 3/2006 | Tsuchitani et al. |
| 2006/0118900 A1 | 6/2006 | Zeghbroeck |
| 2006/0151831 A1 | 7/2006 | Ninomiya et al. |
| 2007/0001230 A1 | 1/2007 | Lee et al. |
| 2007/0145514 A1 | 6/2007 | Kocon |
| 2007/0272979 A1 | 11/2007 | Saito et al. |
| 2008/0315299 A1* | 12/2008 | Saito ............ H01L 29/7811 257/329 |
| 2009/0079002 A1 | 3/2009 | Lee et al. |
| 2010/0163972 A1 | 7/2010 | Saggio et al. |
| 2011/0042742 A1 | 2/2011 | Bhalla et al. |
| 2011/0204442 A1* | 8/2011 | Guan ............ H01L 29/0634 257/342 |
| 2012/0018800 A1* | 1/2012 | Kim ............ H01L 29/0634 257/330 |
| 2012/0161274 A1 | 6/2012 | Lee et al. |
| 2013/0307066 A1* | 11/2013 | Hsieh ............ H01L 29/7827 257/331 |
| 2014/0264477 A1* | 9/2014 | Bhalla ............ H01L 29/0619 257/263 |

OTHER PUBLICATIONS

U.S. Appl. No. 15/843,327 to Yi Su et al. filed Dec. 15, 2017.
U.S. Appl. No. 15/856,828 to Karthik Padmanabhan filed Dec. 28, 2017.

* cited by examiner ical schematic diagram illustrating portions of a trench MOSFET device according to aspects of the present disclosure.
METHOD OF MANUFACTURING LV/MV SUPER JUNCTION TRENCH POWER MOSFETS

FIELD OF THE DISCLOSURE

This invention relates in general to metal-oxide-semiconductor field-effect transistors (MOSFETs), and more specifically superjunction MOSFET devices and a process for fabricating the same.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like. Power MOSFETs have typically been developed for applications requiring power switching and power amplification.

In a power MOSFET, it is desirable to have a high breakdown voltage (BV). The breakdown voltage of a device indicates the ability of the device to withstand breakdown under reverse voltage conditions. In a typical transistor, much of the breakdown voltage is supported by a drift region. In order to reduce the conductivity of the drift region and provide a higher breakdown voltage, it needs to increase the thickness of the drift region or decrease the impurity concentration of the drift region.

It is also desirable for a power MOSFET to reduce the resistance of the device during conduction (i.e., on-resistance $R_{ds-on}$). The on-resistance $R_{ds-on}$ is determined by the resistance of the channel and the resistance of the drift region. Specifically, the resistivity of the drift region is determined by the impurity concentration and the thickness of the drift region. In other words, while conductivity of the drift region can be reduced to improve the breakdown voltage, the on-resistance $R_{ds-on}$ would be adversely affected. Accordingly, these exists a trade-off relationship between optimization of on-resistance and breakdown voltage in a conventional transistor.

A superjunction structure provides a way to decrease on-resistance $R_{ds-on}$ of a power MOSFET device without adversely affecting its breakdown voltage. Specifically, it includes alternating P-type and N-type doped columns formed in the drift region. If a reverse bias is applied to the gate structure, the device enters an off-state where a depletion region can be spread at P-N junction between the columns. Since the alternating P and N type columns are in substantial charge balance, these columns deplete one another and allow the device to sustain a high breakdown voltage. For a superjunction structure, the on-resistance $R_{ds-on}$ increases in direct proportion to the breakdown voltage BV, which is a much less dramatic increase than in the conventional semiconductor structure. A superjunction structure may therefore have significantly lower $R_{ds-on}$ than a conventional MOSFET device for the same high breakdown voltage (BV) (or conversely may have a significantly higher BV than a conventional MOSFET for a given $R_{ds-on}$).

In addition, the significant amount of current through the device can lead to significant electric field (E), which can damage the device absent sufficient safeguards. In order to mitigate the risk of damage due to large electric fields, a termination region is disposed at an outer periphery of the active cell region to attenuate electric field and thus preventing breakdown of the device.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Figure 1A:
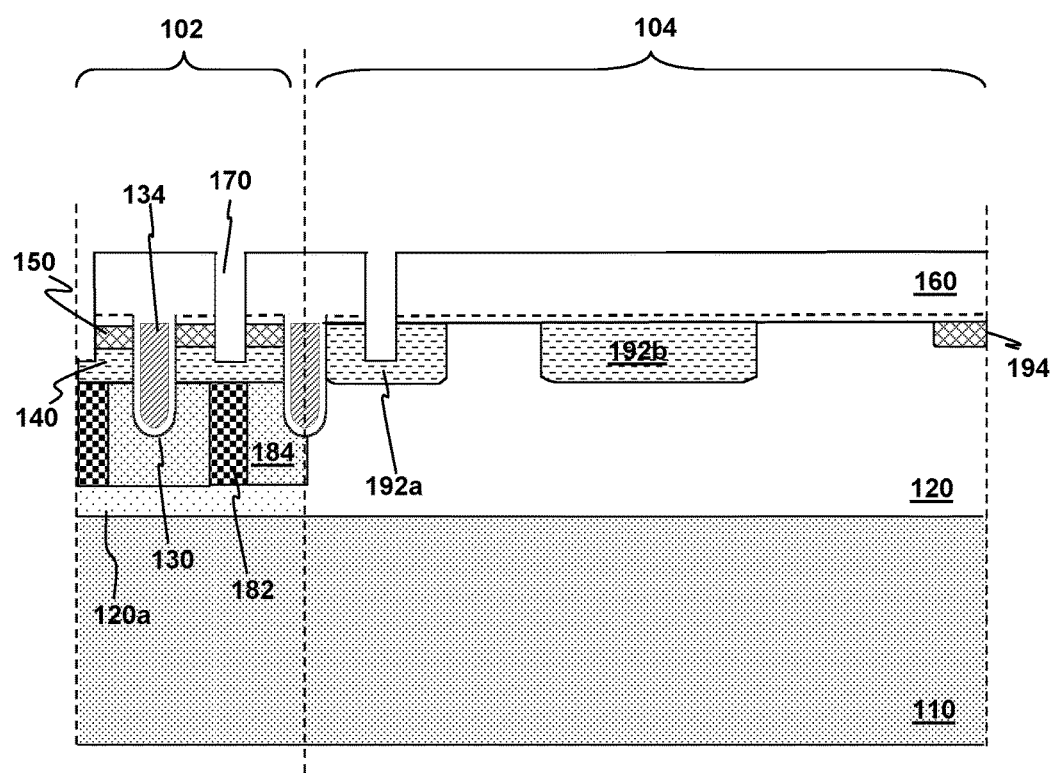
FIG. 1A is a cross-sectional schematic diagram illustrating portions of a trench MOSFET device along line A-A' of FIG. 1B according to aspects of the present disclosure.

In the following Detailed Description, reference is made to the accompanying drawings, which form a part hereof, and in which is shown by way of illustration specific embodiments in which the invention may be practiced. As used herein, a concentration of dopants less than about $10^{16}/cm^3$ may be regarded as "lightly doped" and a concentration of dopants greater than about $10^{17}/cm^3$ may be regarded as "heavily doped". As used herein, a high voltage device is a device with an operating voltage above 500 V. A medium voltage device has an operating voltage between about 40 V and about 500 V and a low voltage device has an operating voltage less than 40 V, preferably between about 8 V and about 40 V.

Introduction

Some designs have been proposed for having the superjunction structure in high voltage devices, such as above 500 V. U.S. Patent Publication Nos. 2002/0066924 to Blanchard and 20120018800A1 to Kim and U.S. Pat. No. 6,979,862 to Henson Worley, the disclosure of which are hereby incorporated herein as reference, disclose forming superjunction structures in the active cell region. U.S. Pat. No. 8,772,868 to Yedinak et al. and U.S. Pat. No. 8,575,690 to Hsieh, the disclosure of which are hereby incorporated herein as reference, disclose forming superjunction structures in the termination region. These proposed designs are for high voltage devices and require additional masks in the process (e.g., for deep termination trench).

Aspects of the present disclosure disclose a superjunction trench MOSFET device for low voltage or medium voltage devices. A medium voltage device has an operating voltage between about 40 V and about 500 V and a low voltage device has an operating voltage less than 40 V, preferably between about 8 V and about 40 V. The superjunction trench MOSFET device according to aspects of the present disclosure comprises an active cell region and a termination region disposed at an outer periphery of the active cell region. The active cell region comprises an array of device cells with the superjunction structure. The termination region may comprise a termination structure. In one embodiment, the termination structure includes guard rings in an intrinsic semiconductor epitaxial layer. In one embodiment, the termination structure includes an array of floating P columns. In another embodiment, the termination structure includes an array of floating P columns and floating termination trenches. The superjunction trench MOSFET device according to aspects of present disclosure provides low on-resistance $R_{ds-on}$ due to superjunction structures. It also provides robust load switch performance because large electric fields are pushed down to P-column structures and thereby releasing the electric fields at the bottom of the gate trench. In addition, the fabrication process for the superjunction trench MOSFET device according to aspects of present disclosure does not require additional masks, such as a mask for termination trenches. Furthermore, the fabrication process window for the trench MOSFET device according to aspects of present disclosure is easy to control with high accuracy ion implantation.

In the following embodiments, the MOSFET device is described as an N-type superjunction trench MOSFET device in which the source region and drain region for the device cells have N type conductivity and the body region has P type conductivity. It is noted that these conductivity types may be reversed in order to obtain a P type superjunction trench MOSFET. It is also noted that a MOSFET device according to aspects of the present disclosure may be a single poly MOSFET device or a shielded gate trench MOSFET device.

Embodiment 1

Figure 1B:
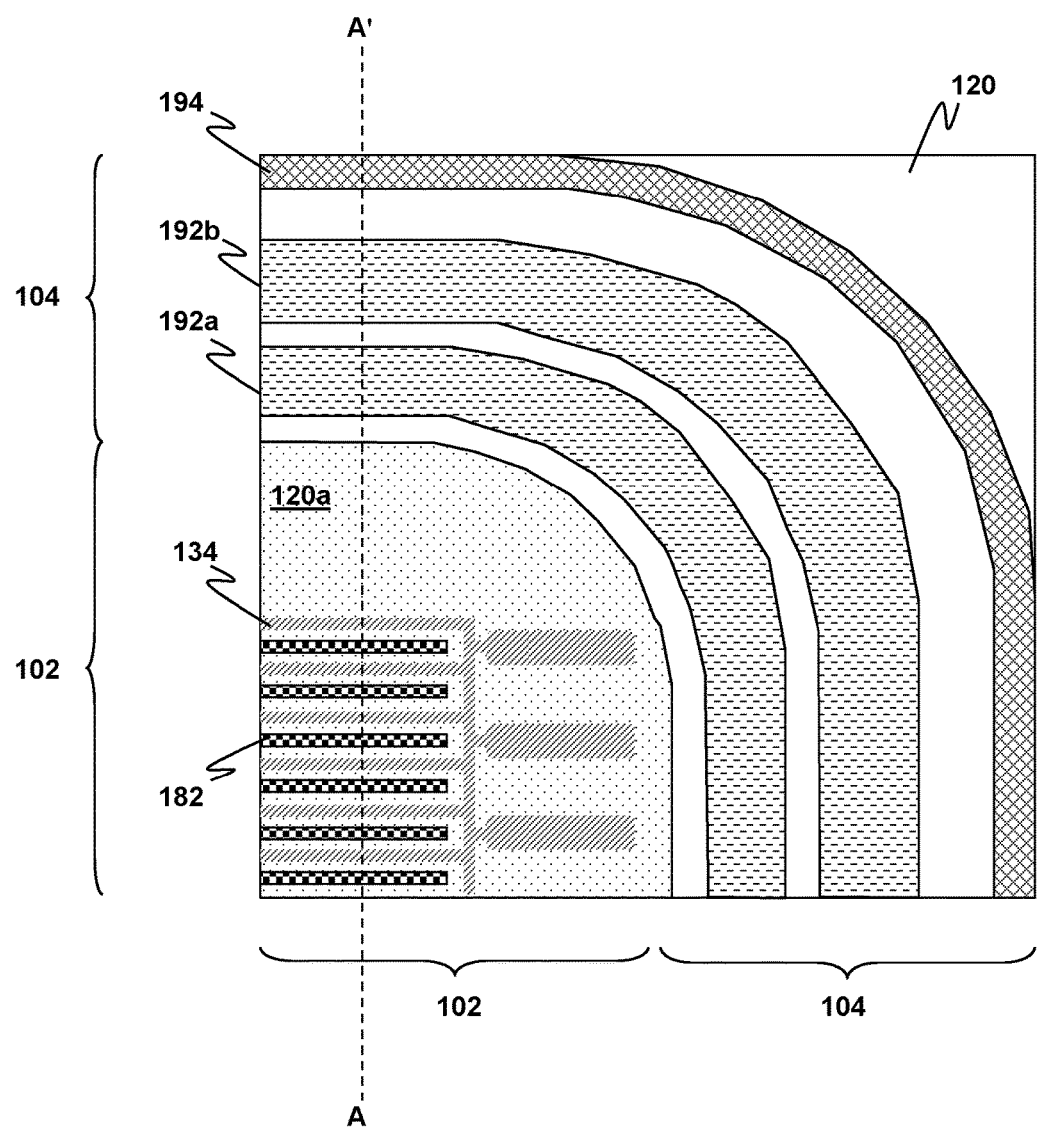
FIG. 1B is a top view schematic diagram illustrating portions of a trench MOSFET device according to aspects of the present disclosure.

FIGS. 1A and 1B show portions of a trench MOSFET device 100 according to aspects of the present disclosure. FIG. 1A shows a cross-sectional view of the trench MOSFET device 100 along line A-A' of FIG. 1B. FIG. 1B shows portions of a corresponding top view.

The N-type superjunction trench MOSFET device 100 includes an active cell region 102 and a termination region 104 disposed at an outer periphery of the active cell region 102. The active cell region 102 may comprise an array of device cells. Each device cell comprises an N-type lightly doped drift region 120a on top of a highly doped N-type semiconductor substrate 110, and a P-type body region 140 formed near the upper portions of the drift region 120a. In addition, the device cell comprises a gate electrode 134 forming in a gate trench 130 extending in the body region 140 and the drift region 120a, and a highly doped N-type source region 150 formed near the upper portions of the body region 140 on the opposite sides of the source contact trench 170. A source contact (not shown) formed in the source contact trench 170 provides an external connection to the source regions 150. The gate electrode 134 is electrically isolated from the source contact (not shown) by a dielectric layer 160. Under the source contact trench 170, a P column 182 is disposed within the lightly doped drift region 120a between the adjacent gate trenches 130. In addition, an N column 184 is provided within the drift region 120a under or adjacent to the bottom of the gate trench 130. The alternating P column 182 and N column 184 form a superjunction structure.

For a self-aligned superjunction, both P column and N column implants are needed if the drift region 120a is an intrinsic (i.e., un-doped) epitaxial (Epi) layer. Alternatively, if the drift region 120a is an Epi layer doped at the right doping concentration, only P column implant is needed. In such a case, a self-aligned approach is not necessary.

The termination region 104 may comprise a termination structure and a channel stop ring 194. In one embodiment, the termination structure comprises one or more guard rings (192a and 192b) surrounding the active cell region 102 as shown in FIG. 1B. The multiple guard rings (192a and 192b) and the channel stop ring 194 are formed in a drift region 120 on top of the semiconductor substrate 110. The multiple guard rings may comprise a first type guard ring 192a and one or more second type guard rings 192b. The first type guard ring 192a is connected with the source region 150. The second type guard ring 192b is a floating guard ring which has floating voltage in the termination region 104. The channel stop 194 is connected to the silicon outside the termination, which prevents formation of a channel from the outside termination to the active region. The drift region 120 is an intrinsic semiconductor epitaxial layer (i.e., an undoped layer). Since the drift region 120 in the termination region 104 is an intrinsic semiconductor, a higher breakdown voltage can be obtained in the termination region 104. For the MOSFET devices according to this embodiment, the breakdown voltage in the termination region is about 42.8 V which can be used for 25 V and 30 V devices.

For low voltage devices (about 8 V to about 40 V), the pitch of the gate trenches 130 and the pitch of the P column 182 may be about 1 to 2 microns. For medium voltage (about 40 V to about 500 V), the pitch of the gate trenches 130 and the pitch of the P column 182 may be about 2 to 8 microns. In some embodiments, an orthogonal P column array arrangement may be used. Specifically, the P column array can be arranged perpendicular to the gate trench array. As such, the gate trench array may have a narrow pitch size, and the pitch size for the P column can be different from the pitch size for the gate trenches. The pitch size for orthogonal P columns may be narrower than that for non-orthogonal P columns. This orthogonal approach may help further lower on-resistance value.

Fabrication Process for Embodiment 1

FIGS. 2A-2M are cross-sectional schematic diagrams illustrating a fabrication process for a trench MOSFET device of FIG. 1A according to aspects of the present disclosure.

Figure 2A:
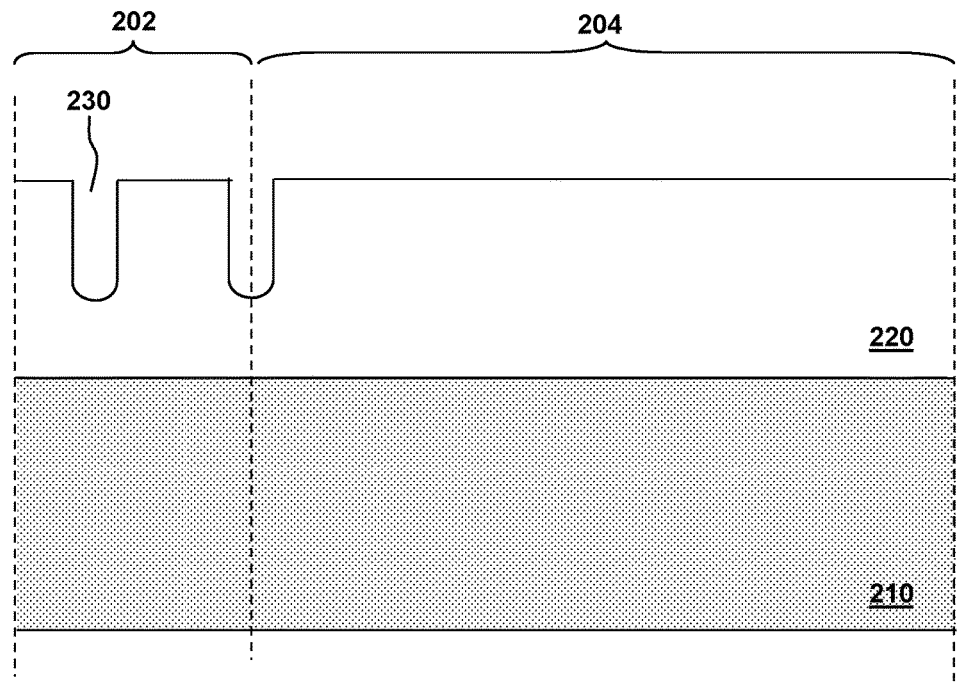
FIGS. 2A-2M are cross-sectional schematic diagrams illustrating a method for fabricating a trench MOSFET device of FIG. 1A according to aspects of the present disclosure.

Referring to FIG. 2A, the process uses a semiconductor substrate 210 of a first conductivity as a starting material. In one embodiment, the semiconductor substrate 210 is a heavily doped N-type semiconductor substrate. An intrinsic semiconductor epitaxial layer 220 is provided on top of the semiconductor substrate 210. A trench mask (not shown) applied on the intrinsic epitaxial layer 220 includes openings to define locations of a plurality of gate trenches for the trench transistors of the MOSFET device. In FIG. 2A, an etching process is performed and the corresponding portions of the underlying intrinsic epitaxial layer 220 are etched down to form a plurality of the gate trenches 230. For low voltage devices (e.g., about 8 V to about 40 V), the pitch of gate trenches 230 may be about 1 to 2 microns. For medium voltage (e.g., about 40 V to about 500 V), the pitch of gate trenches 230 may be about 2 to 8 microns. Once the trenches 230 have been formed and the trench mask has been removed, a sacrificial oxide layer (not shown) may be grown and then removed to improve the silicon surface.

Figure 2B:
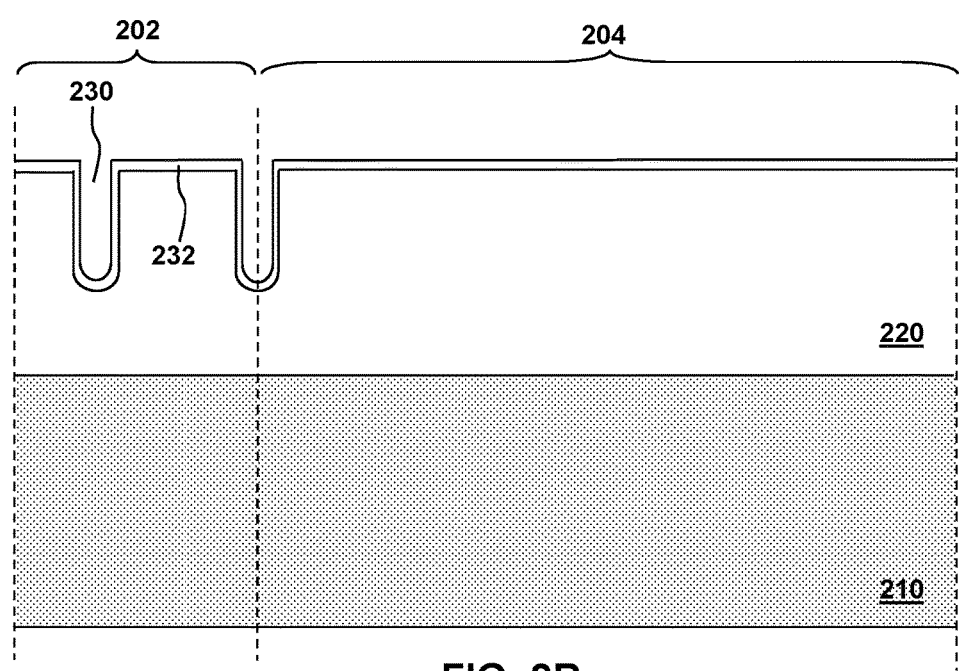
Figure 2C:
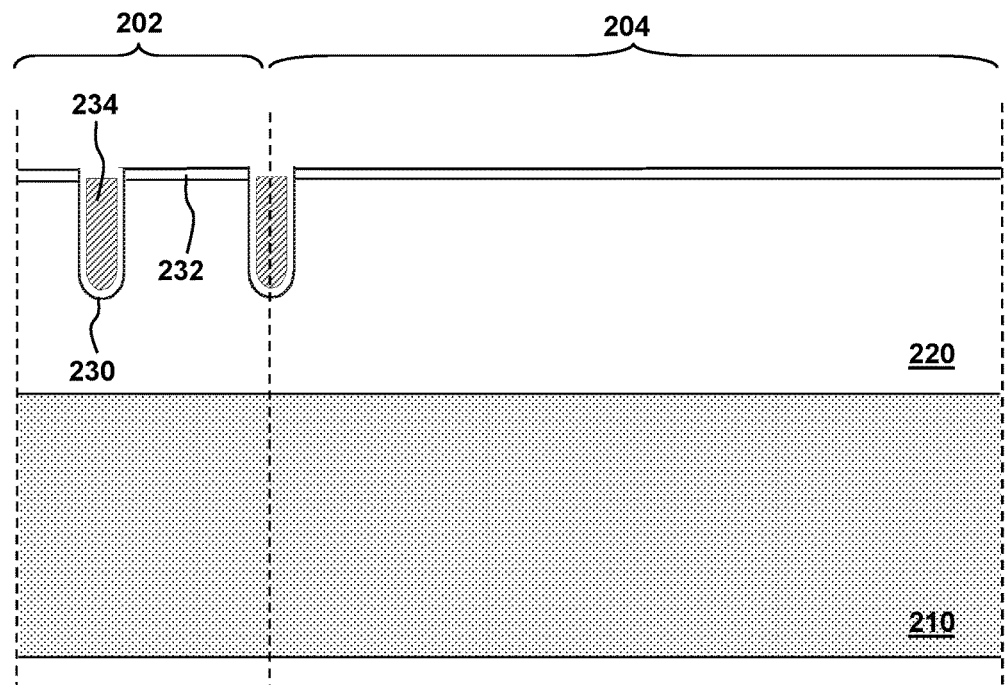

Referring to FIG. 2B, an insulating layer (e.g., gate oxide) 232 is then formed on the top surface of the epitaxial layer 220 and along the inner surface of the gate trenches 230. In FIG. 2C, a conductive material is then deposited over the gate oxide layer 232 followed by an etch back process or a chemical-mechanical planarization (CMP) process to form a gate electrode 234 in the gate trench 230. In some embodiments, the conductive material can be in-situ doped or undoped polysilicon.

Figure 2D:
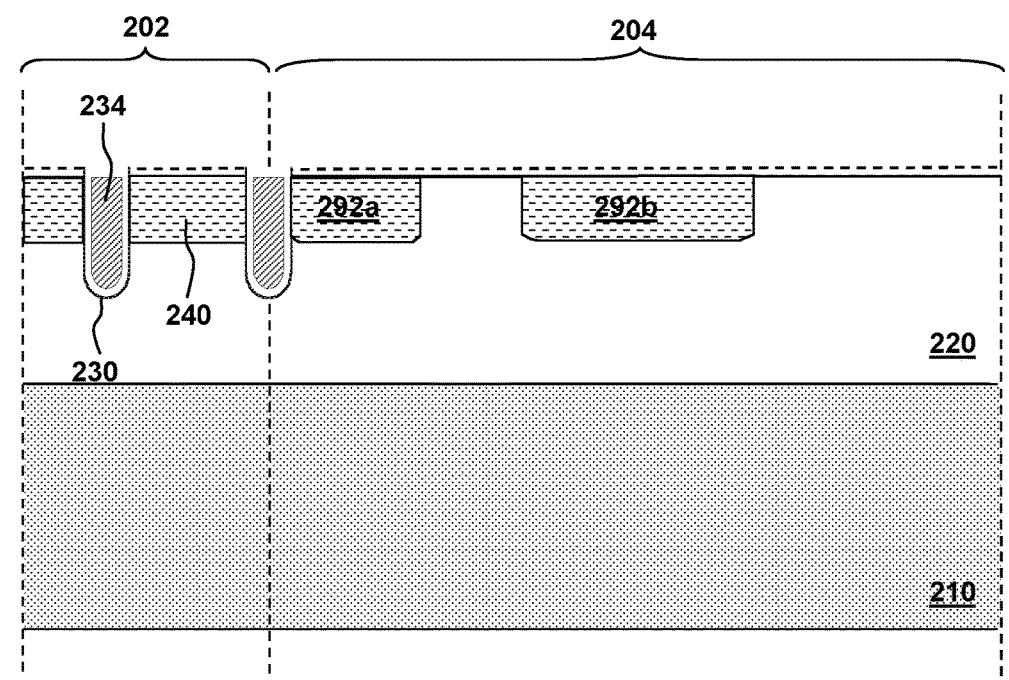

Referring to FIG. 2D, a body mask (not shown) is applied on the intrinsic epitaxial layer 220 which covers the termination region 204 and leaves the active cell region 202 and guard rings uncovered. A body implant is performed within the active cell region 202. The dopant ions are of the opposite conductivity type to the doping of the semiconductor substrate 210. In some embodiments, the dopant ions can be Boron ions for an N-type device. In some embodiments, Phosphorous or Arsenic ions can be used for P-type devices. Body drive-in is performed by applying heat to activate dopant atoms and drive dopant diffusion to form the body region 240. The body mask is removed afterward.

Figure 2E:
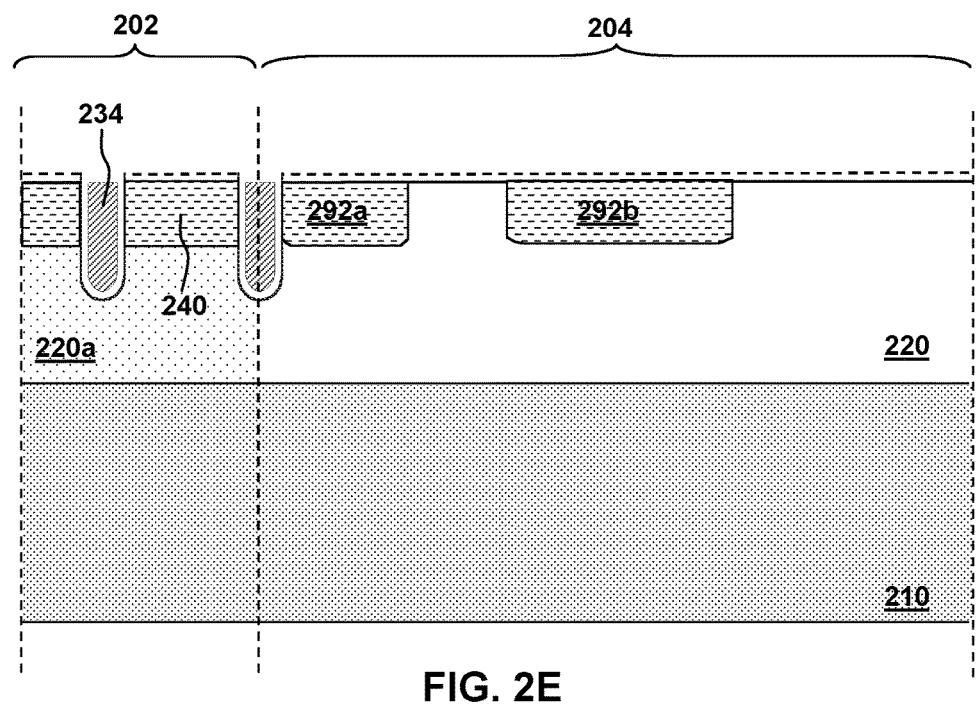

In FIG. 2E, another mask is applied on the intrinsic epitaxial layer 220 which covers the termination region 204 and leaves the active cell region 202 uncovered.

Body mask is different from N-type implantation mask layer. For intrinsic epitaxial layer 220, an N-type implantation mask layer is used to block N-type implantation in the termination region. When the termination region is undoped, high termination breakdown voltage can be achieved with a body guard ring formed by the body mask layer.

An implant is then performed to form doped semiconductor epitaxial layer 220a in the active cell region 202. In some embodiments, this implant may use multiple ion implantation. The dopant ions can be Phosphorous or Arsenic ions for N-type devices. By way of example and not by way of limitation, the highest ion energy for the epi implant may be about 2.2 MeV for 25 V devices. By way of example and not by way of limitation, the doping concentration for the doped epitaxial layer 120a in the active cell region 102 may range from about $1e17/cm^3$ to about $2e17/cm^3$.

Figure 2F:
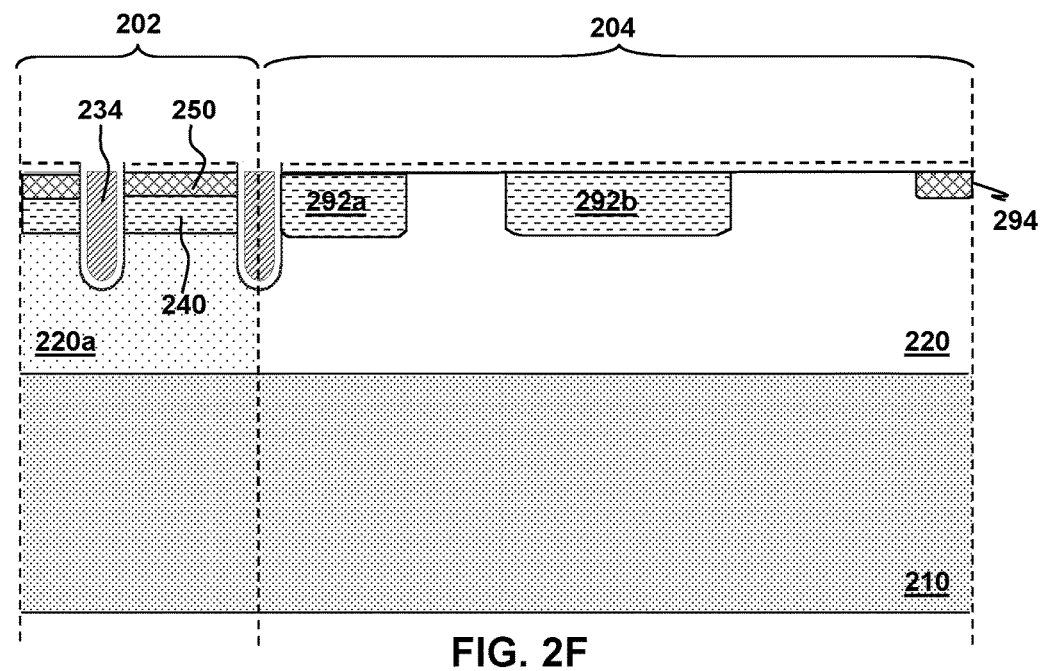

Referring to FIG. 2F, a source implant is performed followed by a source region diffusion. Specifically, the dopant ions are of the same conductivity type to the doping of the semiconductor substrate 210. In some embodiments, Phosphorus or Arsenic ions can be implanted for N-type devices. Source region diffusion is then followed to form a doped source region 250 in the body region 240. A source implant mask is used in this case, since source is not implanted everywhere.

After forming the source region 250, P columns are formed in the lightly doped drift region 220a. In some embodiments, P columns are formed by a self-alignment process. FIGS. 2G-2L illustrate the self-alignment process for forming self-aligned P-type and N-type columns by multiple ion implantation Referring to FIG. 2G, a layer of polysilicon 281 is deposited over the doped epitaxial layer 220a in the active cell region 202 and the intrinsic epitaxial layer 220 in the termination region 204 with a photo resist layer 283 on top of the polysilicon layer 281. Polysilicon layer 281 and the photoresist layer 283 are deposited over both the active cell region and the termination region. But only at the active cell region, is the polysilicon is patterned and etched away. The termination region is blocked from P column and N column implantation.

Figure 2G:
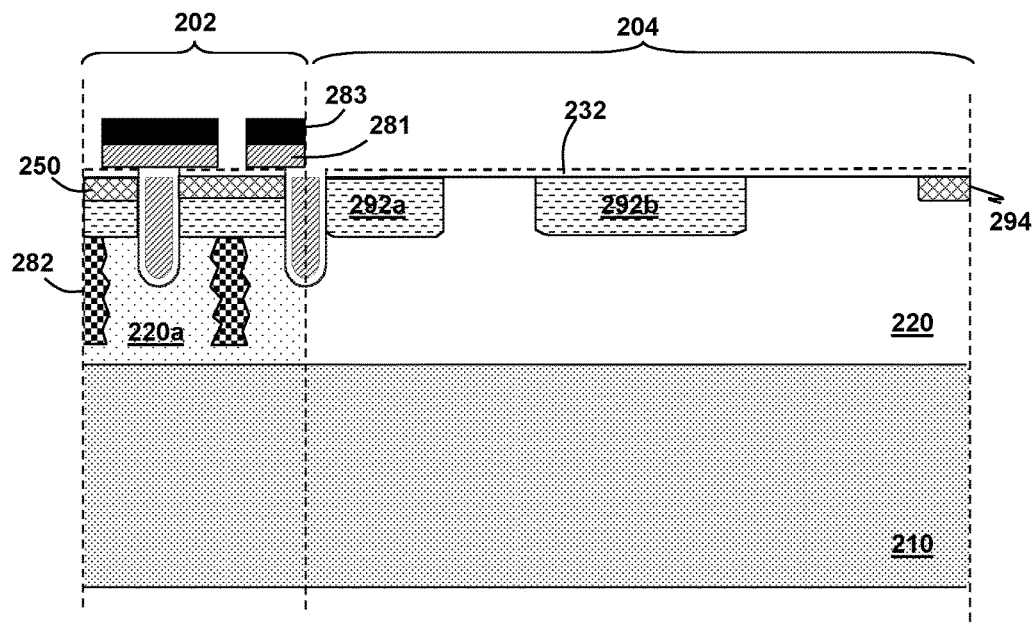
Figure 2H:
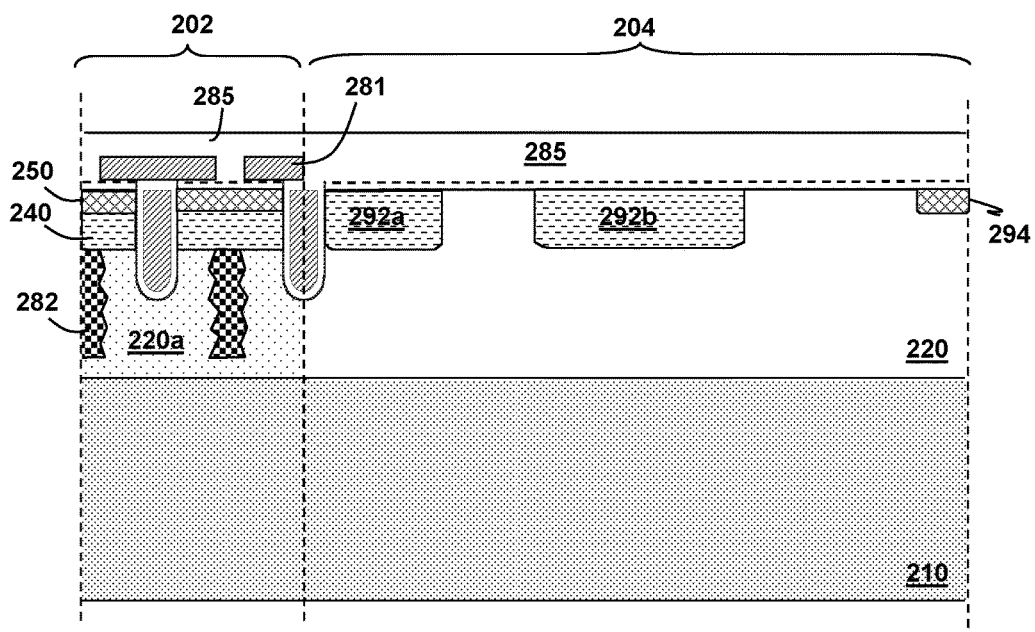

A superjunction mask (not shown) is applied on the photo resist layer 283 with openings to define locations of a plurality of P columns 282 in the active cell region 202 of the N-type trench MOSFET device. An etching process is followed and the corresponding portions of the underlying polysilicon layer 281 are etched down up to the top surface of the insulating layer 232 over the doped epitaxial layer 220a. A superjunction P-type implant is then performed to form P column 282 s as shown in FIG. 2G. For non-orthogonal P columns, the pitch of the P column 282 is about the same as the gate trench pitch. For orthogonal P columns, the pitch of the P column 282 can be different from the gate trench pitch. For the self-aligned superjunction described in this example, an N column implant is needed. By way of example, and not by way of limitation, once the P columns 282 have been formed and the mask has been removed, a layer of oxide 285 may be deposited over the doped epitaxial layer 220a in the active cell region 202 and the intrinsic epitaxial layer 220 in the termination region 204 as shown in FIG. 2H.

Figure 2I:
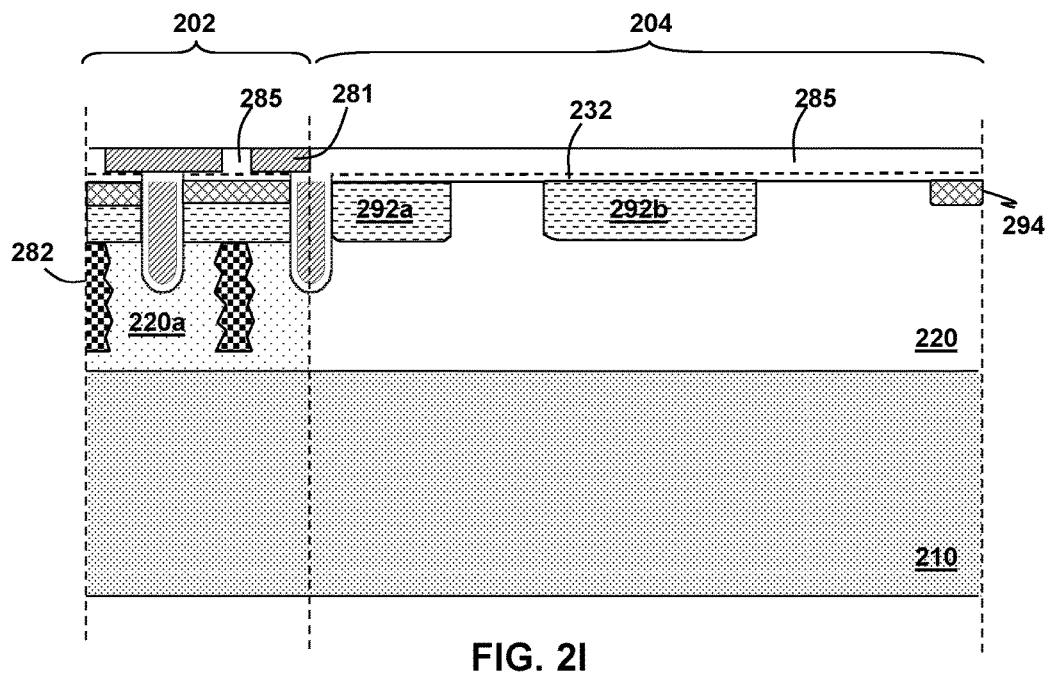
Figure 2J:
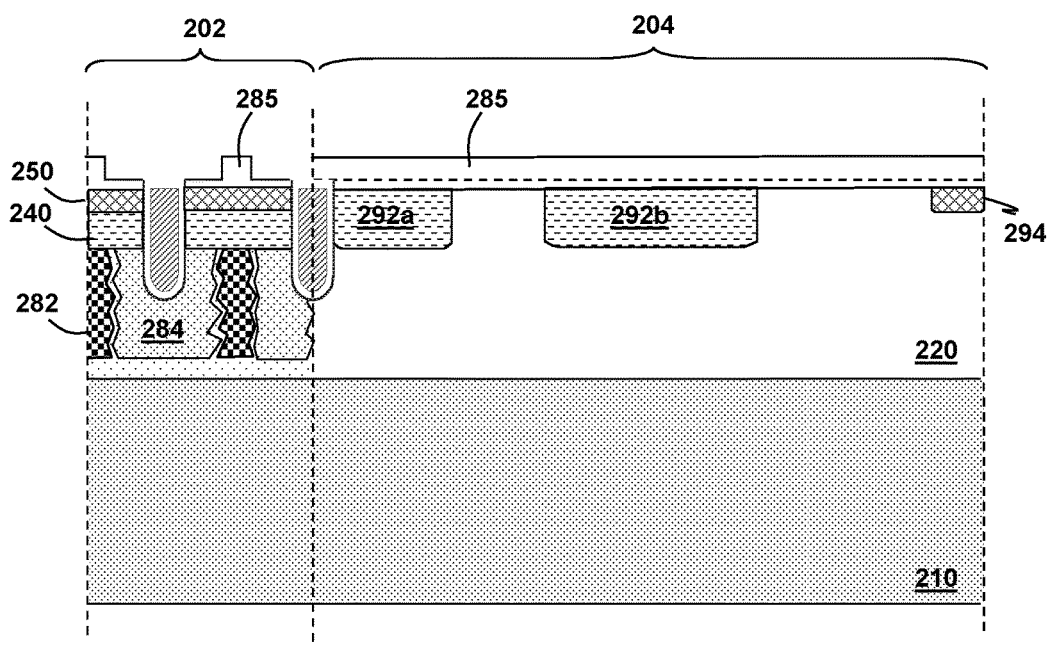
Figure 2K:
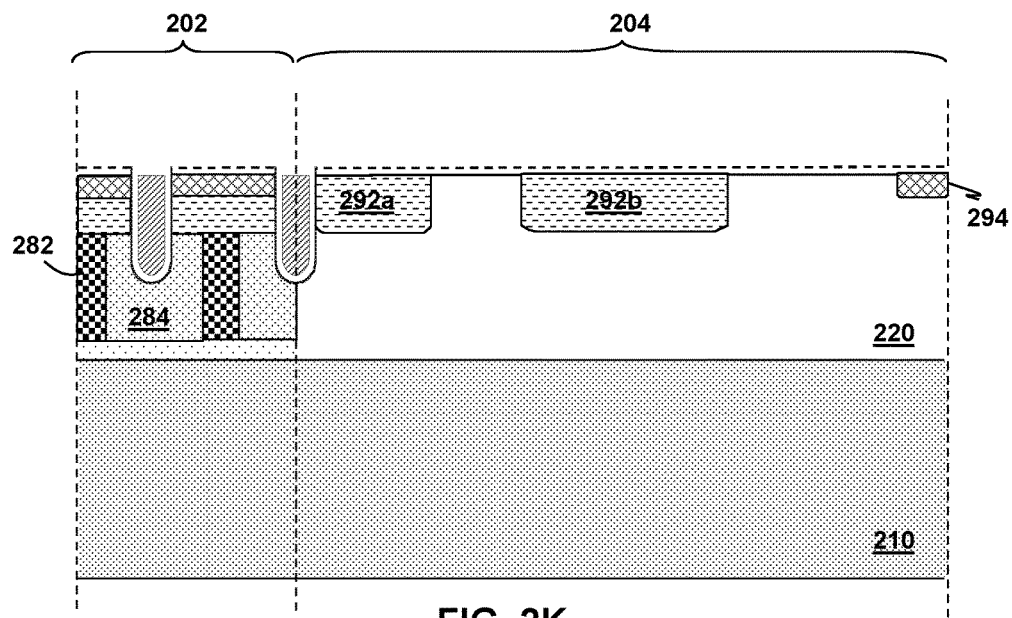

A CMP process may then be used to remove portions of the oxide layer 285 as shown in FIG. 2I. Next, the remaining polysilicon layer 281 is removed by an etching process. With the remaining oxide layer 285 serving as a mask, a superjunction N-type implant is then performed to form N-type columns as shown in FIG. 2J. In FIG. 2K, an annealing process is performed followed by removal of the remaining oxide layer 285.

Figure 2L:
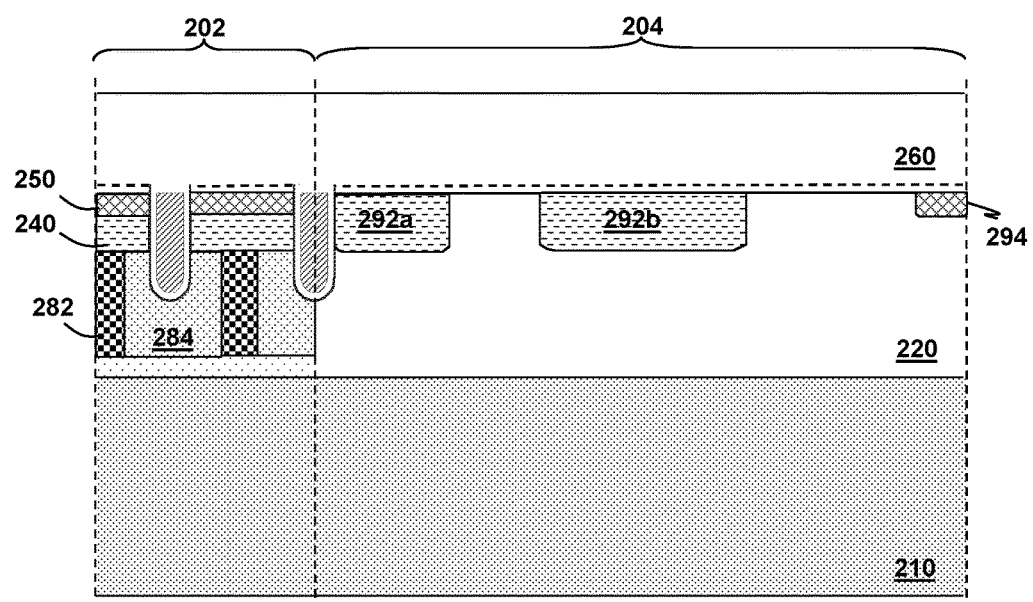

Subsequently, a planarized dielectric layer 260 is deposited over the doped epitaxial layer 220a in the active cell region 202 and the intrinsic epitaxial layer 220 in the termination region 204 as shown in FIG. 2L. In some embodiments, the dielectric layer 260 is formed by a low temperature oxide deposition process with material of Borophosphorosilicate Glass (BPSG).

Figure 2M:
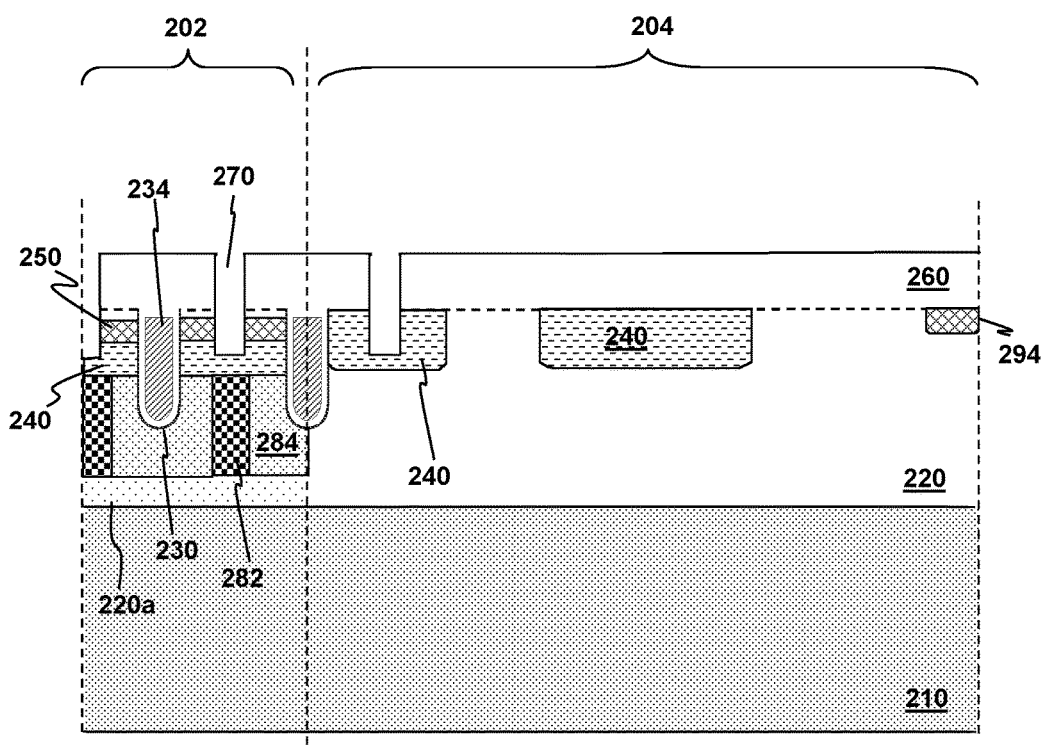

A contact mask (not shown) is then applied on the dielectric layer 260 with a pattern that has an opening at the locations of contact trenches. An etch process is performed to remove the uncovered portions of the dielectric layer 260 and form contact trenches 270 through the source region 250 into the body region 240 as shown in FIG. 2M. A conventional metallization process is then performed (not shown) to complete fabrication of the superjunction trench MOSFET device. In this example, the guard rings are formed by the body mask layer. The channel stop is formed by the source implant by source mask layer.

Embodiment 2

Figure 3A:
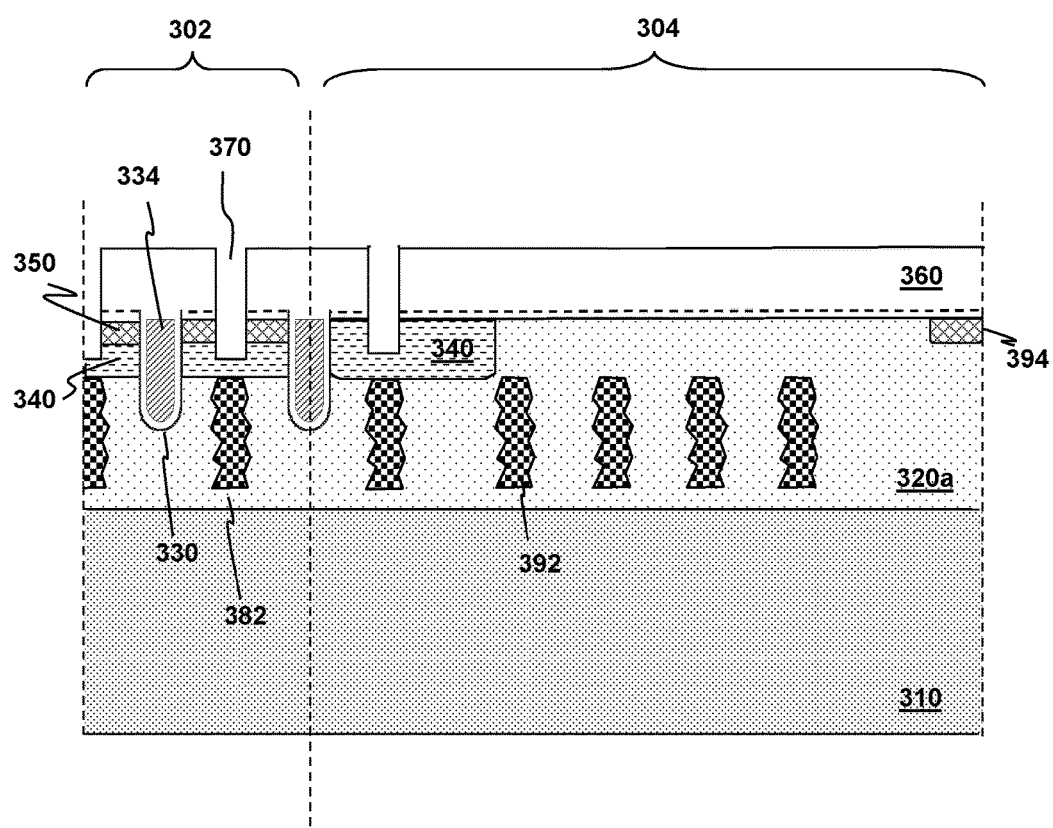
FIG. 3A is a cross-sectional schematic diagram illustrating portions of a trench MOSFET device along line A-A' of FIG. 3B according to aspects of the present disclosure.
Figure 3B:
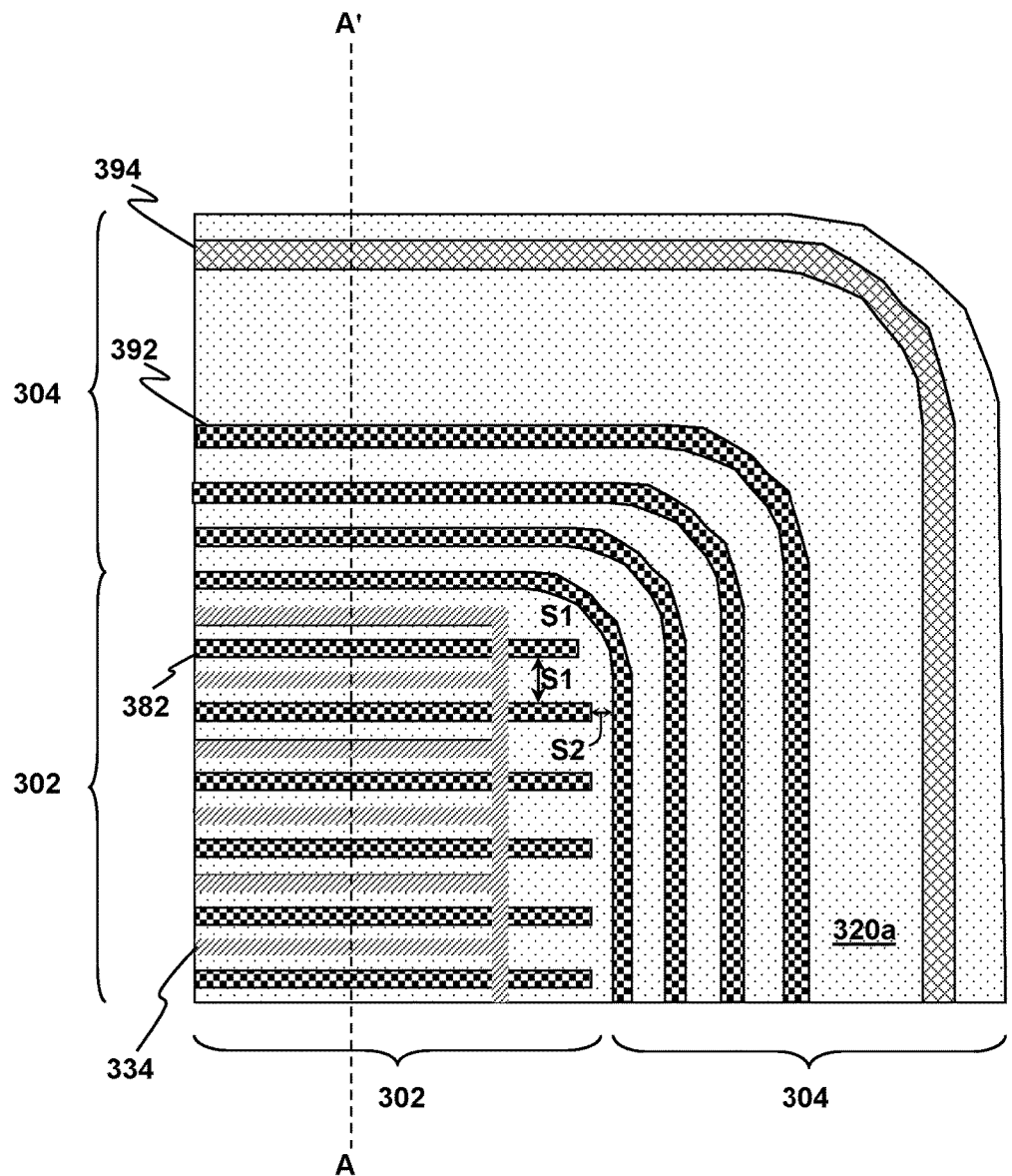
FIG. 3B is a top view schematic diagram illustrating portions of a trench MOSFET device according to aspects of the present disclosure.

FIG. 3A and FIG. 3B show portions of another trench MOSFET device 300 according to aspects of the present disclosure. FIG. 3A shows a cross-sectional view of the trench MOSFET device 300 along line A-A' of FIG. 3B. FIG. 3B shows portions of a corresponding top view of the device.

The N-type superjunction trench MOSFET device 300 includes an active cell region 302 and a termination region 304 disposed at an outer periphery of the active cell region 302. The active cell region 302 may comprise an array of device cells. Each device cell comprises an N-type lightly doped drift region 320a on top of a highly doped N-type semiconductor substrate 310, and a P-type body region 340 formed near the upper portions of the drift region 320a. In addition, the device cell comprises a gate electrode 334 forming in a gate trench 330 extending in the body region 340 and the drift region 320a, and a highly doped N-type source region 350 formed near the upper portions of the body region 340 on the opposite sides of the source contact trench 370. A source contact (not shown) formed in the source contact trench 370 provides an external connection to the source regions 350. The gate electrode 334 is electrically isolated from the source contact (not shown) by a dielectric layer 360. Under the source contact trench 370, a P column 382 is disposed within the lightly doped drift region 320a between adjacent gate trenches 330. The P columns 382 in the lightly doped N-type drift region 320a forms a super-junction structure. The P columns 382 may be separated from each other by a distance S1.

The termination region 304 may comprise a termination structure and a channel stop ring 394, which may be formed during the implant step that forms the source 350. In one embodiment, the termination structure comprises an array of floating P columns 392 surrounding the active cell region 302 as shown in FIG. 3B. An innermost P column 392 in the termination region 304 may be separated from an outermost P column 382 in the active cell region 302 by a distance equal to S1. The ends of the P columns 382 in the active cell region 304 may be separated from the inside edge of the innermost P column 392 in the termination region 304 by a distance S2, which may be one half of S1. The P columns 392 and the channel stop ring 394 are formed in the lightly doped N-type drift region 320a on top of a highly doped N-type semiconductor substrate 310. The channel stop 394 is connected to the silicon outside the termination region The channel stop 394 prevents formation of channel between termination region and active cell region.

Fabrication Process for Embodiment 2

FIGS. 4A-4I are cross-sectional schematic diagrams illustrating a method for fabricating a trench MOSFET device of FIG. 3A according to aspects of the present disclosure.

Figure 4A:
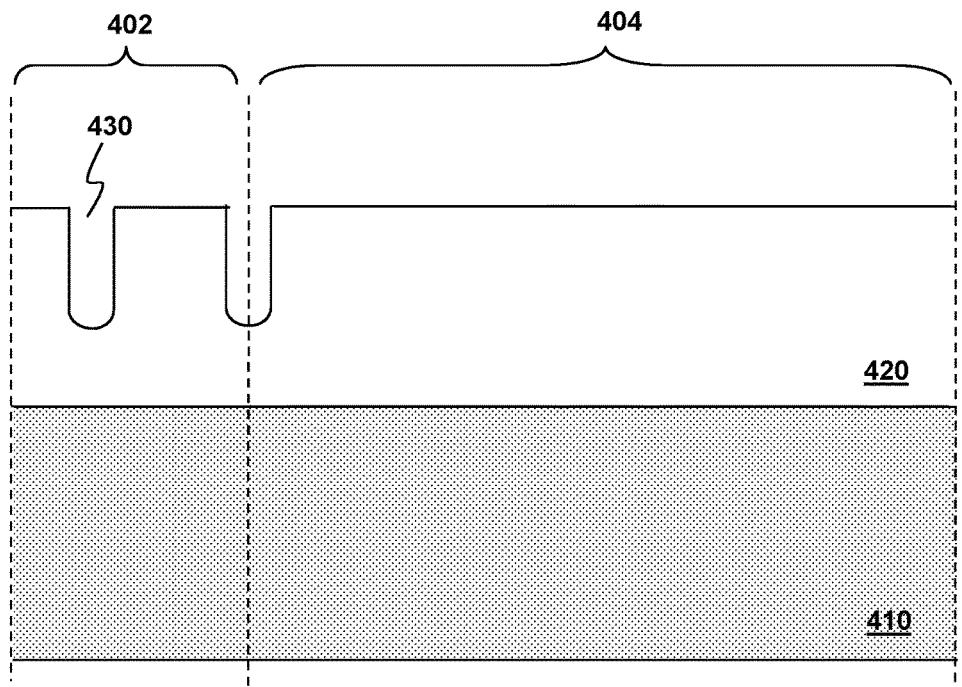
FIGS. 4A-4I are cross-sectional schematic diagrams illustrating a method for fabricating a trench MOSFET device of FIG. 3A according to aspects of the present disclosure.

Referring to FIG. 4A, the process uses a semiconductor substrate 410 of a first conductivity as a starting material. In one embodiment, the semiconductor substrate 410 is a heavily doped N-type semiconductor substrate. An intrinsic semiconductor epitaxial layer 420 is provided on top of the semiconductor substrate 410. A trench mask (not shown) applied on the intrinsic epitaxial layer 420 includes openings to define locations of a plurality of gate trenches for the trench transistors of the MOSFET device. In FIG. 4A, an etching process is performed and the corresponding portions of the underlying intrinsic epitaxial layer 420 are etched down to form a plurality of the gate trenches 430. For low voltage devices (about 8 V to about 40 V), the pitch of gate trenches 430 is about 1 to 2 microns. For medium voltage (about 40 V to about 500 V), the pitch of gate trenches 430 is about 2 to 8 microns. Once the trenches 430 have been formed and the trench mask has been removed, a sacrificial oxide layer (not shown) may be grown and then removed to improve the silicon surface.

Figure 4B:
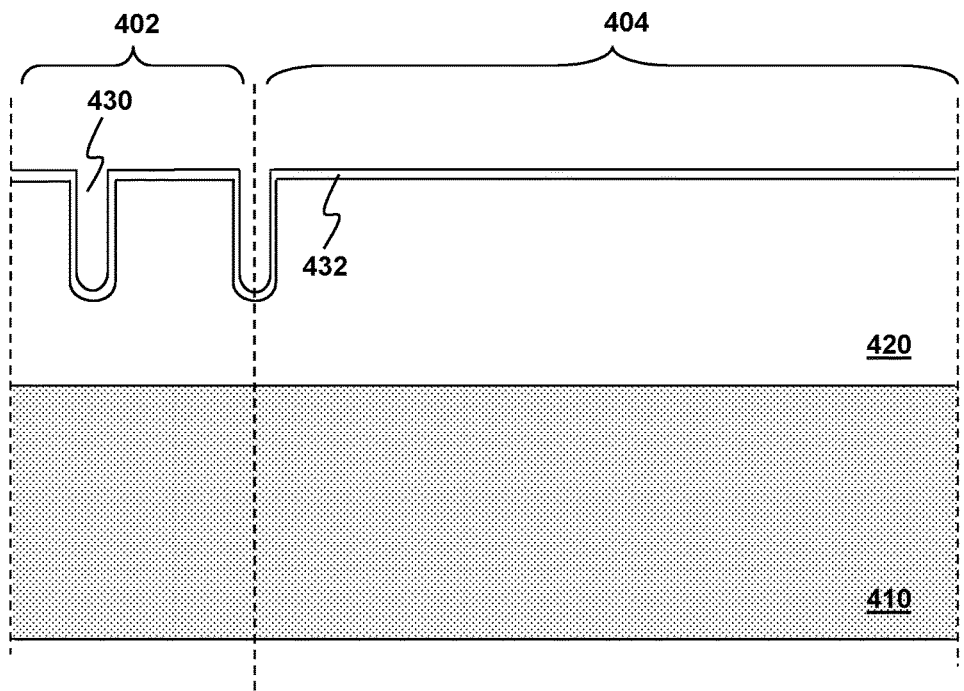
Figure 4C:
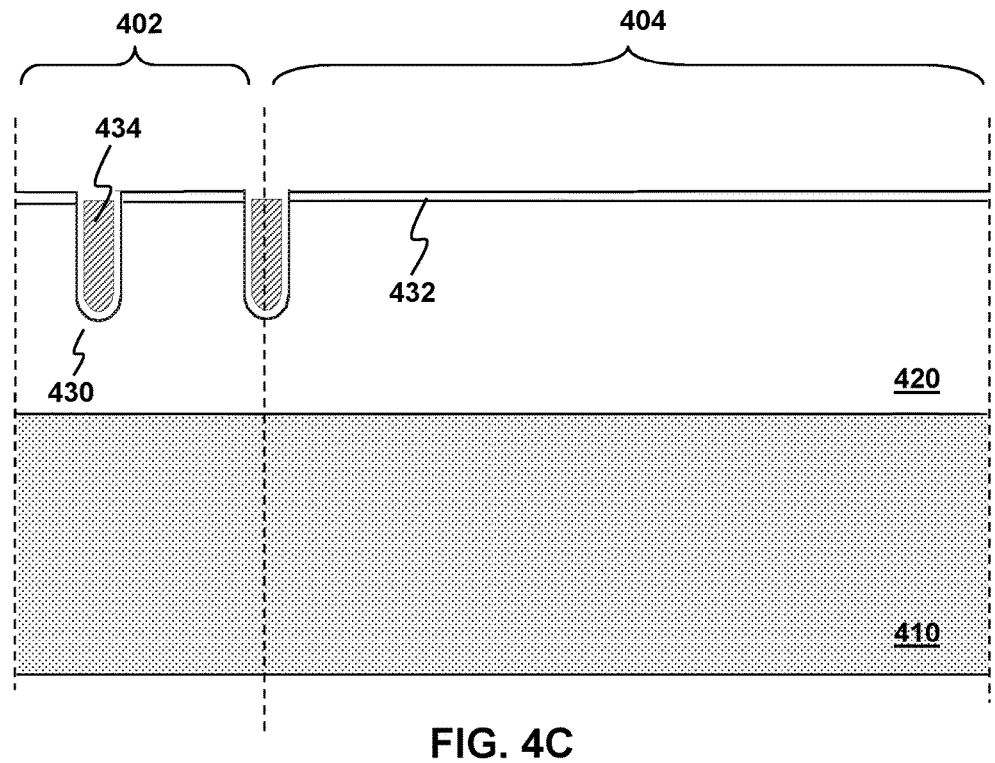

Referring to FIG. 4B, an insulating layer (e.g., gate oxide) 432 is then formed on the top surface of the epitaxial layer 420 along the inner surface of the gate trenches 430. In FIG. 4C, a conductive material is then deposited over the gate oxide layer 432 followed by an etch back process or a chemical-mechanical planarization (CMP) process to form a gate electrode 434 in the gate trench 430. In some embodiments, the conductive material can be in-situ doped or undoped polysilicon.

Figure 4D:
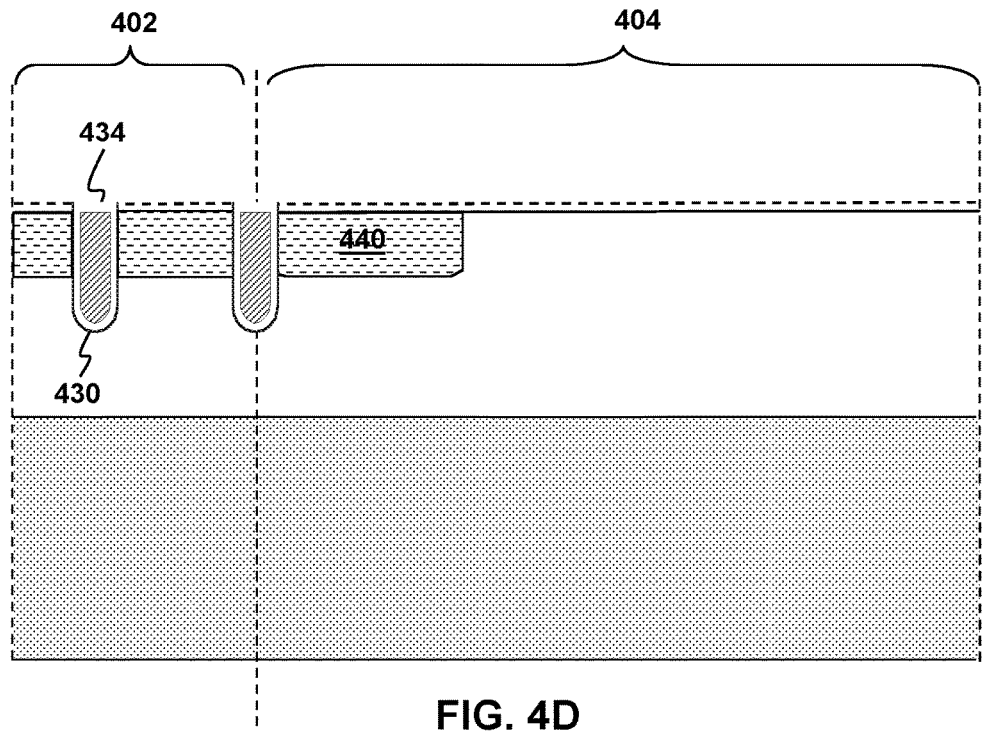

Referring to FIG. 4D, a body mask (not shown) is applied on the intrinsic epitaxial layer 420 which covers the termination region 404 and leaves the active cell region 402 uncovered. A body implant is performed within the active cell region 402. The dopant ions are of the opposite conductivity type to the doping of the semiconductor substrate 410. In some embodiments, the dopant ions can be Boron ions for an N-type device. In some embodiments, Phosphorous or Arsenic ions can be used for P type devices. Body drive-in is performed by applying heat to activate dopant atoms and drive dopant diffusion to form the body region 440. The body mask is removed afterward.

Figure 4E:
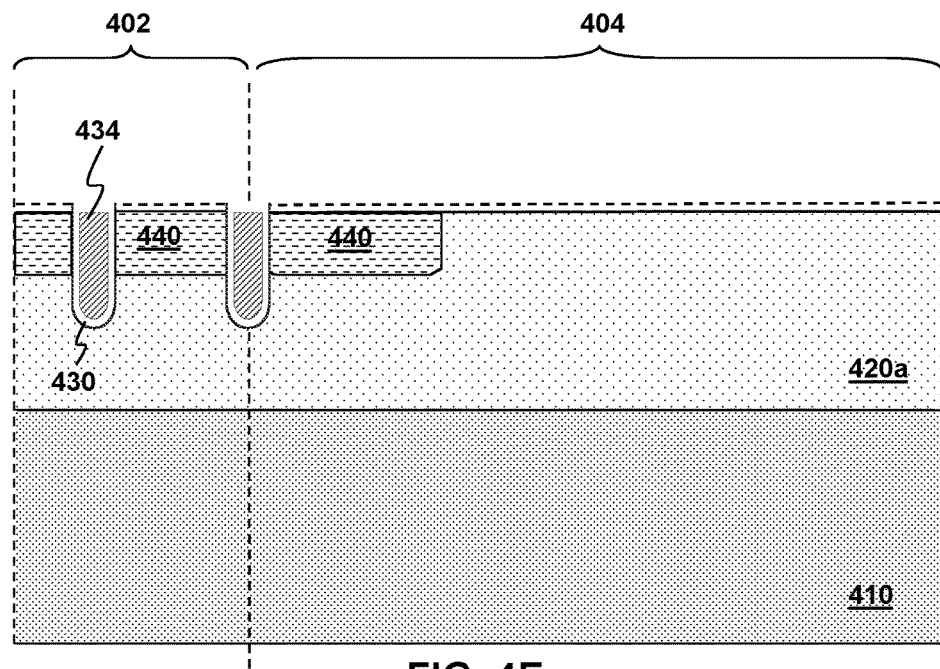

In FIG. 4E, a blanket implant of dopant ions (e.g., N-type ions for N type devices) is performed on the intrinsic epitaxial layer 420 to form doped semiconductor epitaxial layer 420a in both the active cell region 402 and the termination region 404. In some embodiments, this implant may use multiple ion implantation process. The dopant ions can be Phosphorous or Arsenic ions can be used for N type devices. By way of example and not by way of limitation, the highest ion energy for the epi implant may be about few MeV. By way of example and not by way of limitation, the doping concentration for the doped epitaxial layer 420a may range from about 1e17/cm$^3$ to about 2e17/cm$^3$. It is noted that for N-type MOSFET devices, the N-type ion implantation on the intrinsic epitaxial layer 420 can be performed prior to or after body drive-in. As for P-type MOSFET devices, P type multiple ion implantation on the intrinsic epitaxial layer 420 is preferred to be performed after body drive-in when a single intrinsic epitaxial layer is used. Alternatively, P-type ion implantation can be performed before trench formation when multiple intrinsic layers are used.

Figure 4F:
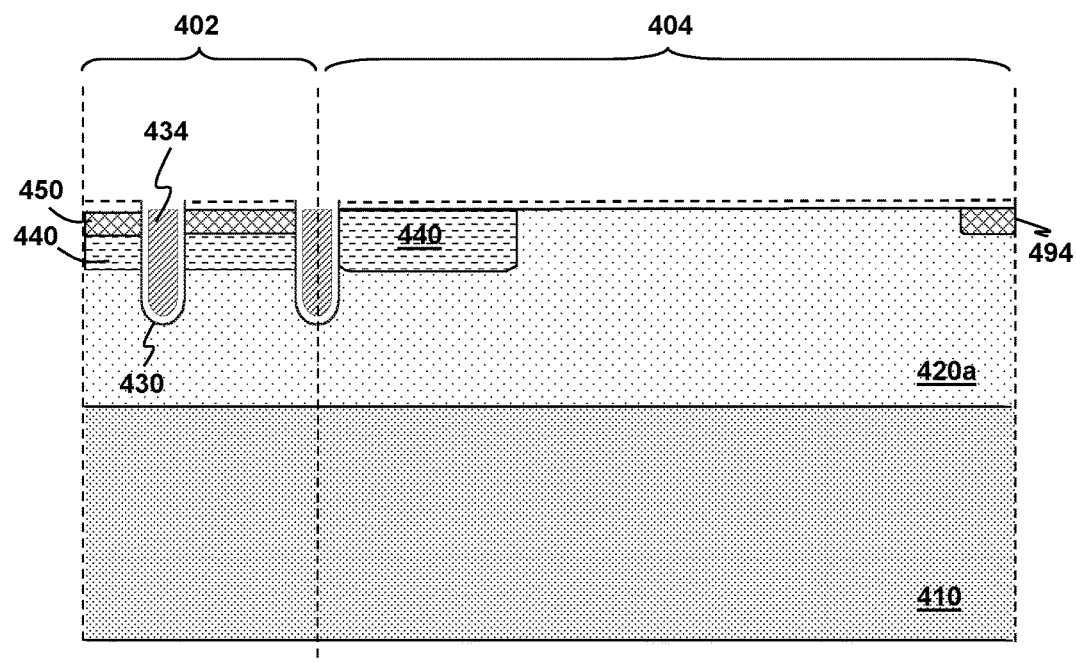

Referring to FIG. 4F, a source implant is performed followed by a source region diffusion. Specifically, the dopant ions are of the same conductivity type to the doping of the semiconductor substrate 410. In some embodiments, Phosphorus or Arsenic ions can be implanted for an N-type device. Source region diffusion is then followed to form a doped source region 450 in the body region 440.

By using a source mask, the source dopants may be selectively implanted in the active cell region to form the source region 450 and a channel stop region 494.

Figure 4G:
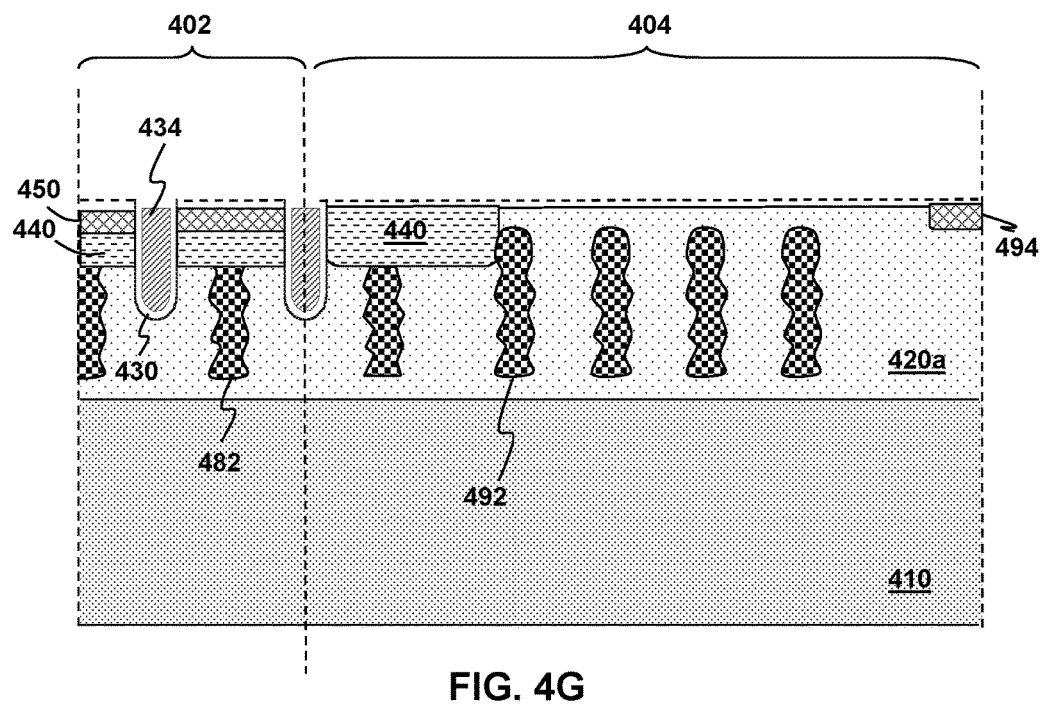

After forming the source region 450, P columns are formed within the lightly doped drift region 420a both in the active cell region 402 (i.e., P-column 482) and the termination region 404 (i.e., floating P-column 492) as shown in FIG. 4G. It is noted that the array of the P columns 492 in the termination region 404 are floating columns. The floating P column array forms a termination structure. In some embodiments, the P columns 482 and 492 may be formed by a multiple ion implantation. High energy up to 900 keV may be used for multiple ion implantation to form P columns.

In addition to the multiple ion implantation process, P columns may be formed by first growing a thin intrinsic semiconductor epitaxial layer in a thickness of about 1.5 um and then performing ion implantation of P-type and N-type species to form a first charge balance layer. Another thin intrinsic semiconductor epitaxial layer is next grown on the first charge balance layer followed by an N-type and P-type implantation to form a second charge balance layer with alternating P-type and N-type doped column array. Thereafter, the devices are formed on top of the second charge balance layer. In other words, the column implant is performed before trench formation and this approach requires a wider pitch. In the foregoing example, a wider P column pitch is required. The pitch of trench and pitch of P column are the same for non-orthogonal approach. For orthogonal approach, only the P column pitch is wider.

Under this approach, less ion implantation energy is required for both N-type and P-type implantation.

For non-orthogonal P columns, the pitch of the P column 482 is about the same as the gate trench pitch. For orthogonal P columns, the pitch of the P column 482 can be different from the gate trench pitch. In addition, the pitch of the P columns 492 in the termination region 404 can be different from the pitch of the P column structures 482 in the active cell region 402 in order to achieve high BV in the termination region 404.

The P column pitch determines the breakdown voltage in the termination. Usually, the P column pitch at the termination is the same as the active cell region including spacing. But it can be different. P column spacing is a key parameter for the breakdown voltage. The P column spacing does not have to be spaced equally.

Figure 4H:
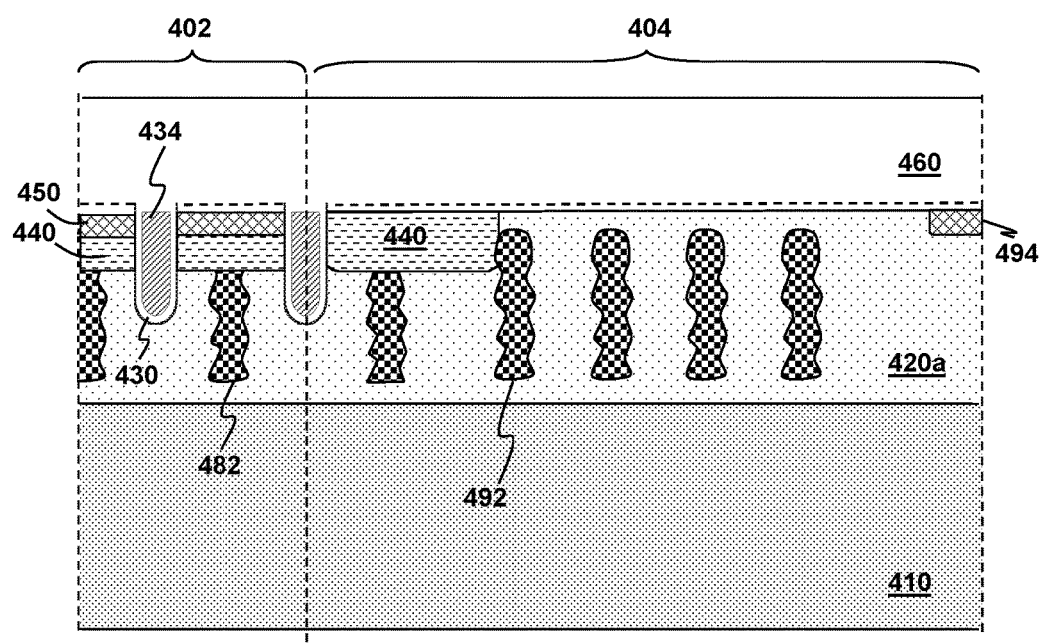

Subsequently, a planarized dielectric layer 460 is deposited over the doped semiconductor epitaxial layer 420a in the active cell region 402 and in the termination region 404 as shown in FIG. 4H. In some embodiments, the dielectric layer 460 is formed by a low temperature oxide deposition process with material of Borophosphorosilicate Glass (BPSG).

Figure 4I:
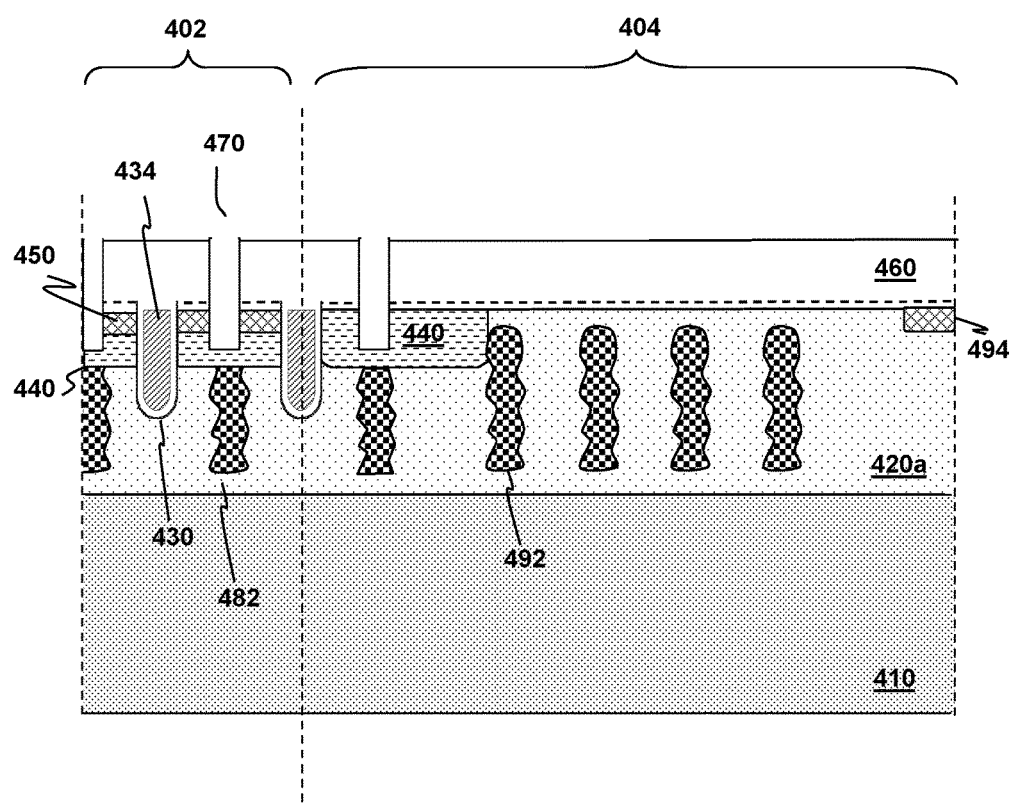

A contact mask (not shown) is then applied on the dielectric layer 460 with a pattern that has an opening at the locations of contact trenches. An etch process is performed to remove the uncovered portions of the dielectric layer 460 and form contact trenches 470 through the source region 450 into the body region 440 as shown in FIG. 4I. A conventional metallization process is then performed (not shown) to complete fabrication of the superjunction trench MOSFET device. The channel stop 494 is formed by implantation of suitable dopants through openings in the source mask layer during source implant.

Embodiment 3

Figure 5A:
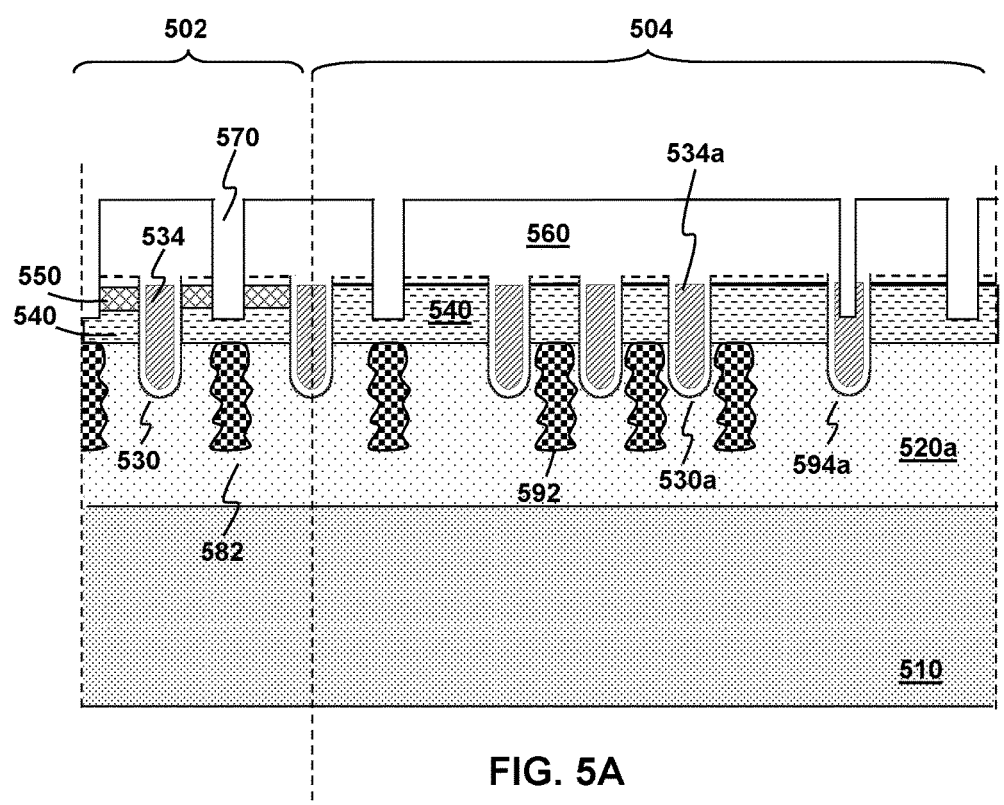
FIG. 5A is a cross-sectional schematic diagram illustrating portions of a trench MOSFET device along line A-A' of FIG. 5B according to aspects of the present disclosure.
Figure 5B:
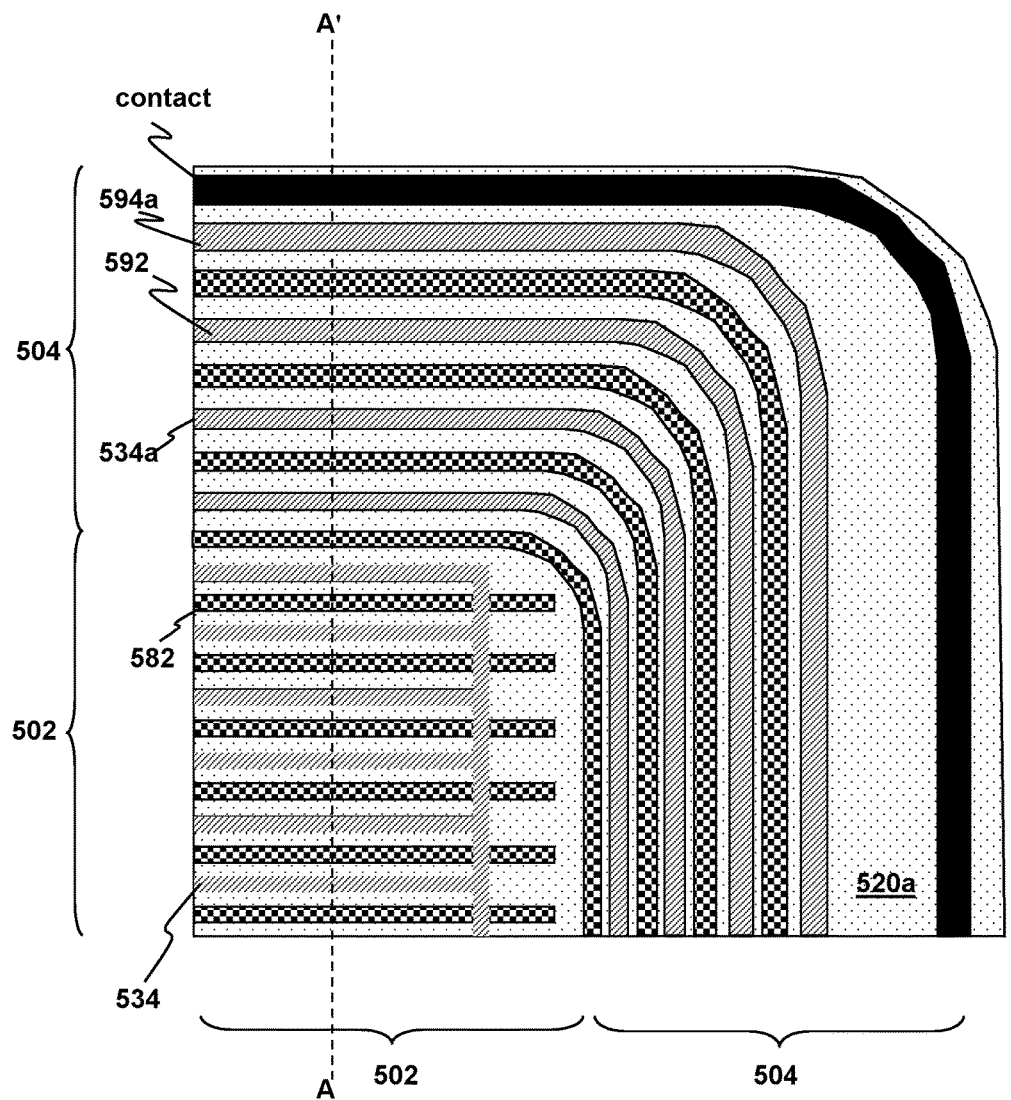
FIG. 5B is a top view schematic diagram illustrating portions of a trench MOSFET device according to aspects of the present disclosure.

FIG. 5A and FIG. 5B shows portions of another trench MOSFET device 500 according to aspects of the present disclosure. FIG. 5A shows a cross-sectional view of the trench MOSFET device 500 along line A-A' of FIG. 5B. FIG. 5B shows portions of a corresponding top view of the device.

The N-type superjunction trench MOSFET device 500 includes an active cell region 502 and a termination region 504 disposed at an outer periphery of the active cell region 502. The active cell region 502 may comprise an array of device cells. Each device cell comprises an N-type lightly doped drift region 520a on top of a highly doped N-type semiconductor substrate 510, and a P-type body region 540 formed near the upper portions of the drift region 520a. In addition, the device cell comprises a gate electrode 534 forming in a gate trench 530 extending in the body region 540 and the drift region 520a, and a highly doped N-type source region 550 formed near the upper portions of the body region 540 on the opposite sides of the source contact trench 570. A source contact (not shown) formed in the source contact trench 570 provides an external connection to the source regions 550. The gate electrode 534 is electrically isolated from the source contact (not shown) by a dielectric layer 560. Under the source contact trench 570, a P column 582 is disposed within the lightly doped drift region 520a.

The termination region 504 may comprise a termination structures and a trench channel stop ring 594. In one embodiment, the termination structure comprises an array of floating P columns 592 and floating termination trenches 530a surrounding the active cell region 502 as shown in FIG. 5B. The termination structure and the trench channel stop ring 594 are formed in the lightly doped N-type drift region 520a on top of a highly doped N-type semiconductor substrate 510. The trench channel stop 594 is connected to the silicon outside the termination region 504 through a metal or poly connection.

Fabrication Process for Embodiment 3

FIGS. 6A-6I are cross-sectional schematic diagrams illustrating a method for fabricating a trench MOSFET device of FIG. 5A according to aspects of the present disclosure.

Figure 6A:
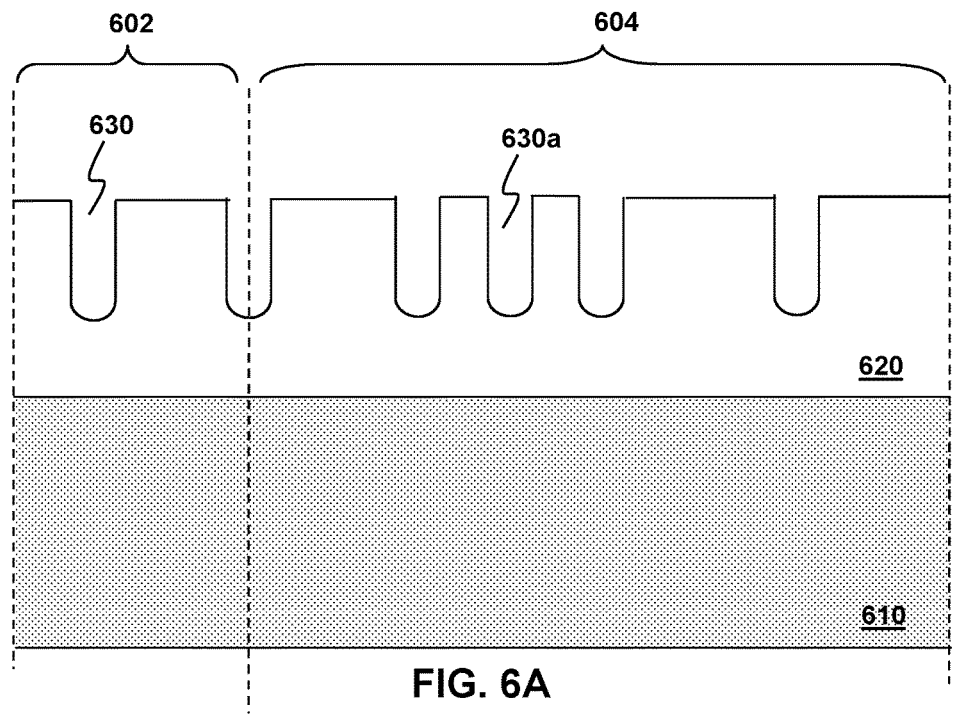
FIGS. 6A-6I are cross-sectional schematic diagrams illustrating a method for fabricating a trench MOSFET device of FIG. 5A according to aspects of the present disclosure.

Referring to FIG. 6A, the process uses a semiconductor substrate 610 of a first conductivity as a starting material. In one embodiment, the semiconductor substrate 610 is a heavily doped N-type semiconductor substrate. An intrinsic semiconductor epitaxial layer 620 is provided on top of the heavily doped N-type semiconductor substrate 610. A trench mask (not shown) applied on the intrinsic epitaxial layer 620 includes openings to define locations of a plurality of gate trenches in the active cell region and the floating trenches in the termination region for the trench transistors of the MOSFET device. In FIG. 6A, an etching process is performed and the corresponding portions of the underlying intrinsic epitaxial layer 620 are etched down to form a plurality of the gate trenches 630 in the active cell region 602 as well as floating trenches 630a in the termination region 604. For low voltage devices (about 8 V to about 40 V), the pitch of gate trenches 630 is about 1 to 2 microns. For medium voltage (about 40 V to about 500 V), the pitch of gate trenches 630 is about 2 to 8 microns. It is noted that the pitch of the floating trenches 630a in the termination region 604 may be different from that of the gate trenches 630 in the active cell region 602 to achieve high termination breakdown voltage. The pitch of floating trench can be the same as active pitch of trench in the termination. It can be wider or smaller than the pitch of the active cell depending on P column and N-type doped epi doping concentration. The floating trench can be spaced evenly in the termination.

Once the trenches 630 have been formed and the trench mask has been removed, a sacrificial oxide layer (not shown) may be grown and then removed to improve the silicon surface.

Figure 6B:
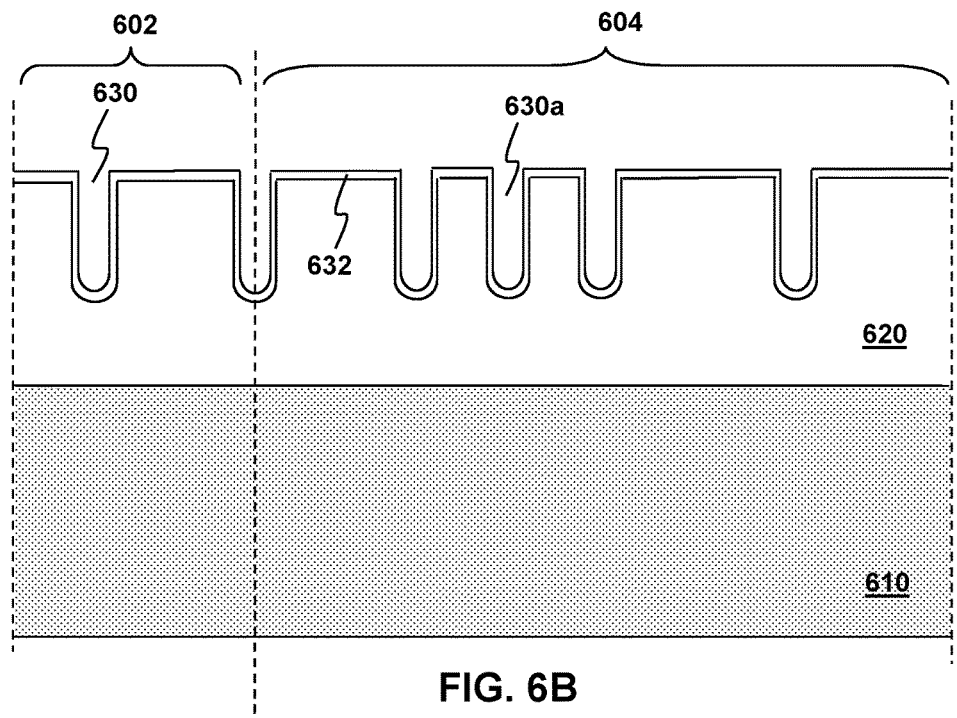
Figure 6C:
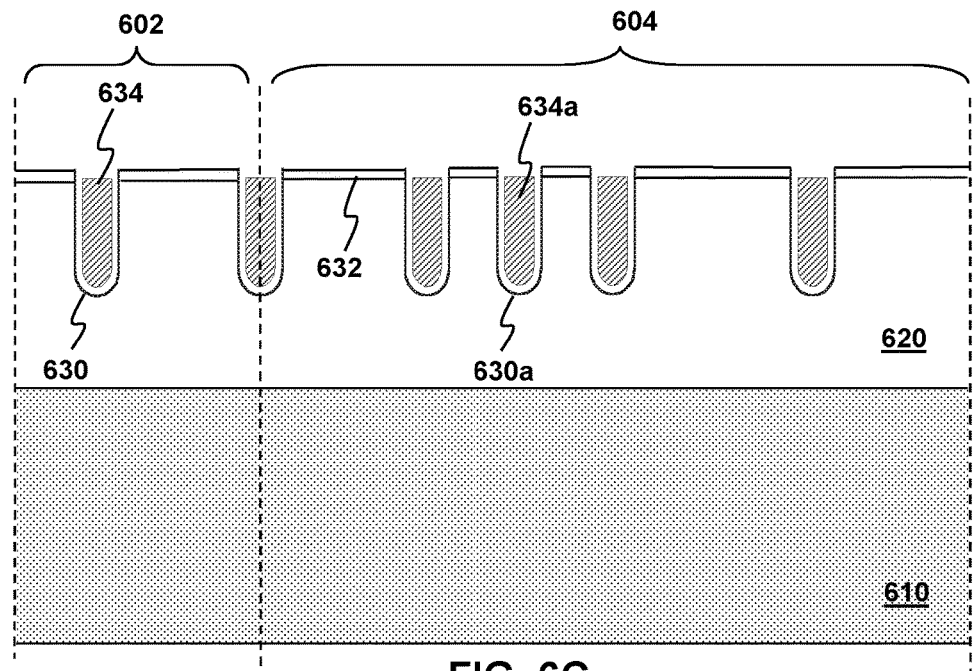

Referring to FIG. 6B, an insulating layer (e.g., gate oxide) 632 is then formed along the inner surface of the gate trenches 630. In FIG. 6C, a conductive material is then deposited over the gate oxide layer 632 followed by an etch back process or a chemical-mechanical planarization (CMP) process to form gate electrodes 634 in the active cell region 602 and floating electrode 634a. In some embodiments, the conductive material can be in-situ doped or undoped polysilicon.

Figure 6D:
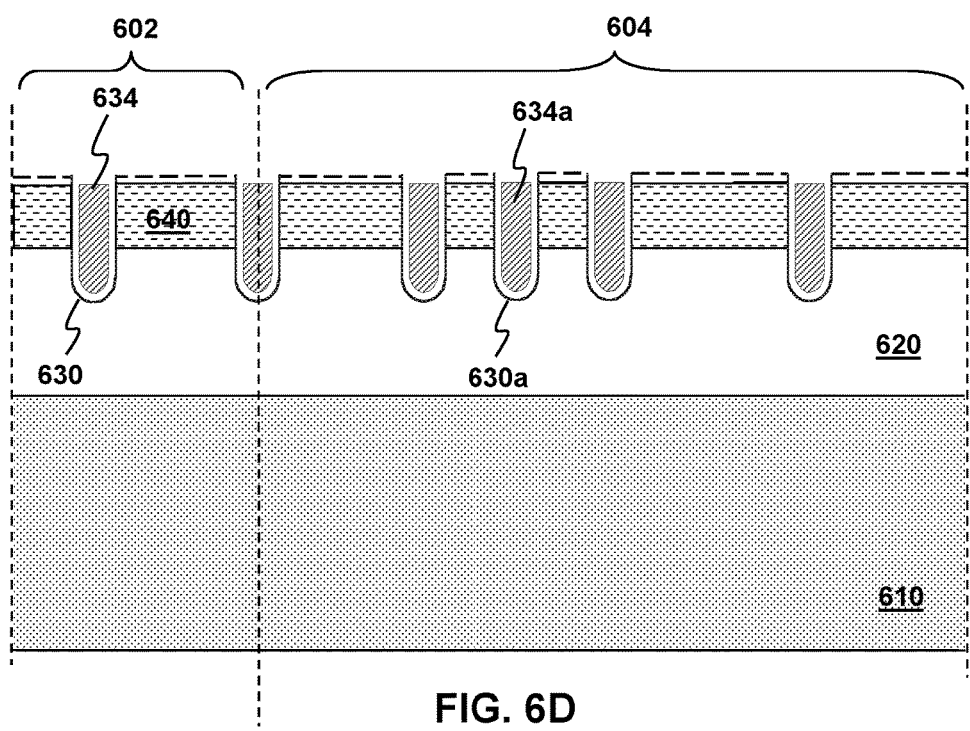

Referring to FIG. 6D, a blanket body implant is performed to form a body region 640 in the active cell region 602 and the termination region 604. The dopant ions are of the opposite conductivity type to the doping of the semiconductor substrate 610. In some embodiments, the dopant ions can be Boron ions for an n-type device. In some embodiments, Phosphorous or Arsenic ions can be used for p-type devices. Body drive-in may then be performed by applying heat to activate dopant atoms and drive dopant diffusion to form the body region 640. When floating trench and P column are used in the termination, a body mask layer is not needed.

Figure 6E:
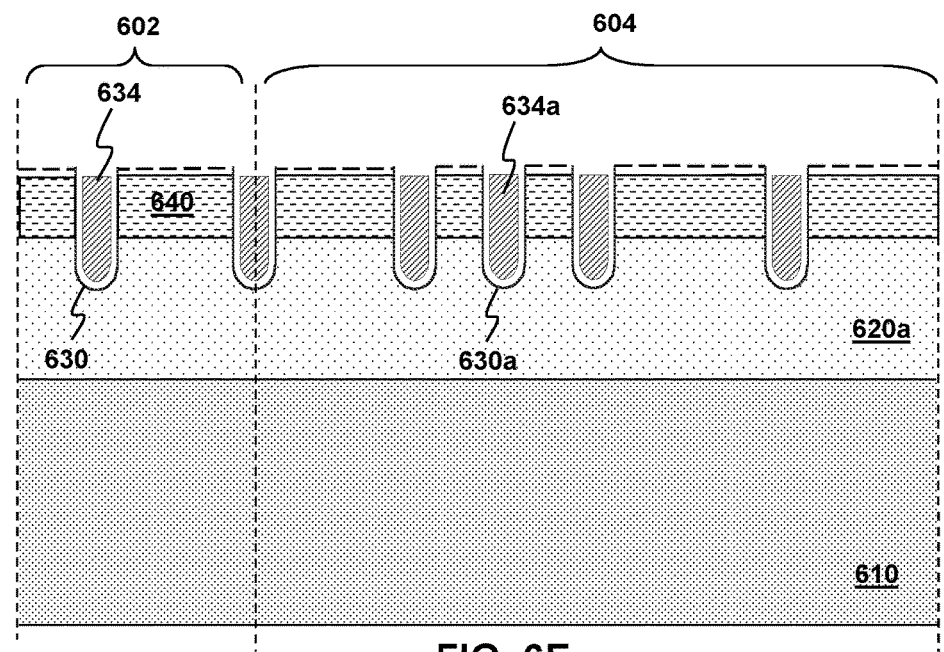

In FIG. 6E, a blanket implant of dopant ions (e.g., N-type ions for N type devices) is performed on the intrinsic epitaxial layer 620 to form a doped semiconductor epitaxial layer 620a in both the active cell region 602 and the termination region 604. In some embodiments, this implant may use multiple ion implantation. The dopant ions can be Phosphorous or Arsenic ions can be used for n-type devices. By way of example and not by way of limitation, the highest ion energy for the implant may be about few MeV. By way of example and not by way of limitation, the doping concentration for the doped epitaxial layer 620a may range from about $1e17/cm^3$ to about $2e17/cm^3$. It is noted that for N-type MOSFET devices, the N-type ion implantation on the intrinsic epitaxial layer 620 can be performed prior to or after body drive-in. As for P-type MOSFET devices, P type multiple ion implantation on the intrinsic epitaxial layer 620 is preferred to be performed after body drive-in when a single intrinsic semiconductor epitaxial layer is used. Alternatively, P-type ion implantation can be performed before trench formation when multiple intrinsic layers are used.

Figure 6F:
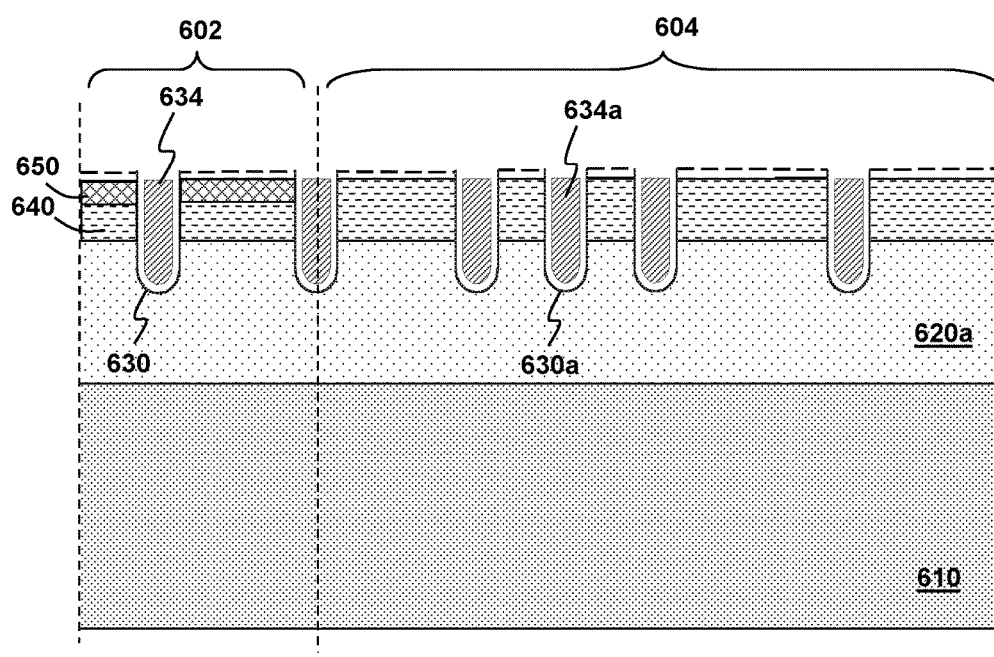

Referring to FIG. 6F, a source implant is performed followed by a source region diffusion. Specifically, the dopant ions are of the same conductivity type to the doping of the semiconductor substrate 610. In some embodiments, Phosphorus or Arsenic ions can be implanted for an N-channel device. Source region diffusion is then followed to form a doped source region 650 in the body region 640. Once again, a source implant mask layer is used, since source is not implanted everywhere.

Figure 6G:
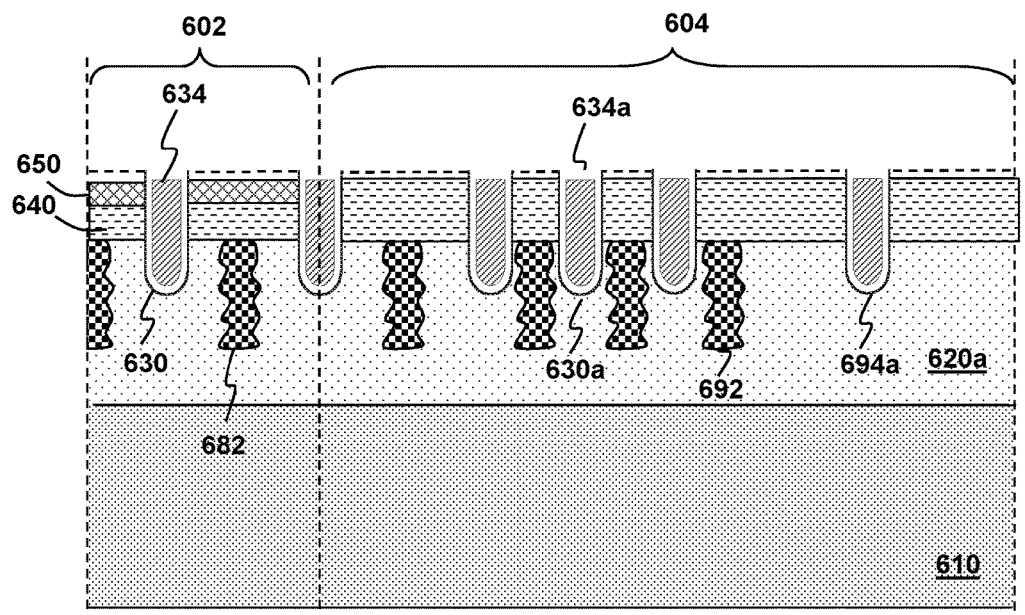

After forming the source region 650, P columns are formed within the lightly doped drift region 620a both in the active cell region 602 (i.e., P-column 682) and the termination region 604 (i.e., floating P-column 692) as shown in FIG. 6G. Specifically, a P column 682 in the active cell region 602 is formed between two adjacent gate trenches underneath a source contact trench which will be formed in a later process step. A floating P column 692 in the termination region 604 is formed between two adjacent floating trenches 630a. The array of floating trenches 630a and P columns 692 forms a termination structure. In some embodiments, the p-type column structures 682 may be formed by a multiple ion implantation. High energy up to 900 keV may be used for the multiple ion implantation process to form P columns.

In other embodiments, the p-type column structures may be formed by first growing a thin intrinsic epi layer in a thickness of about 1.5 um and then performing ion implantation of p-type and n-type species to form a first charge balance layer. A thin intrinsic semiconductor epitaxial layer is grown on the first charge balance layer followed by an n-type and p-type implantation to form a second charge balance layer with alternating p-type and n-type doped column array. Next, the devices are formed on top of the second charge balance layer. Under this approach, less ion implantation energy is required for both n-type and p-type layer.

For non-orthogonal P columns, the pitch of the P column 682 is about the same as the gate trench pitch. For orthogonal P columns, the pitch of the P column 682 can be different from the gate trench pitch. In addition, the pitch of the P columns 692 in the termination region 604 can be different from the pitch of the P column structures 682 in the active cell region 602 in order to achieve high BV in the termination region 604. The pitch of P columns 692 in the termination can be the same as that of the P columns 682 in the active cell region. The P column can be spaced evenly. But it can be different from active cell, and spaced not evenly. By way of example, and not by way of limitation, the range of variation of pitch of floating P columns 692 may be +/−0.5 μm.

Figure 6H:
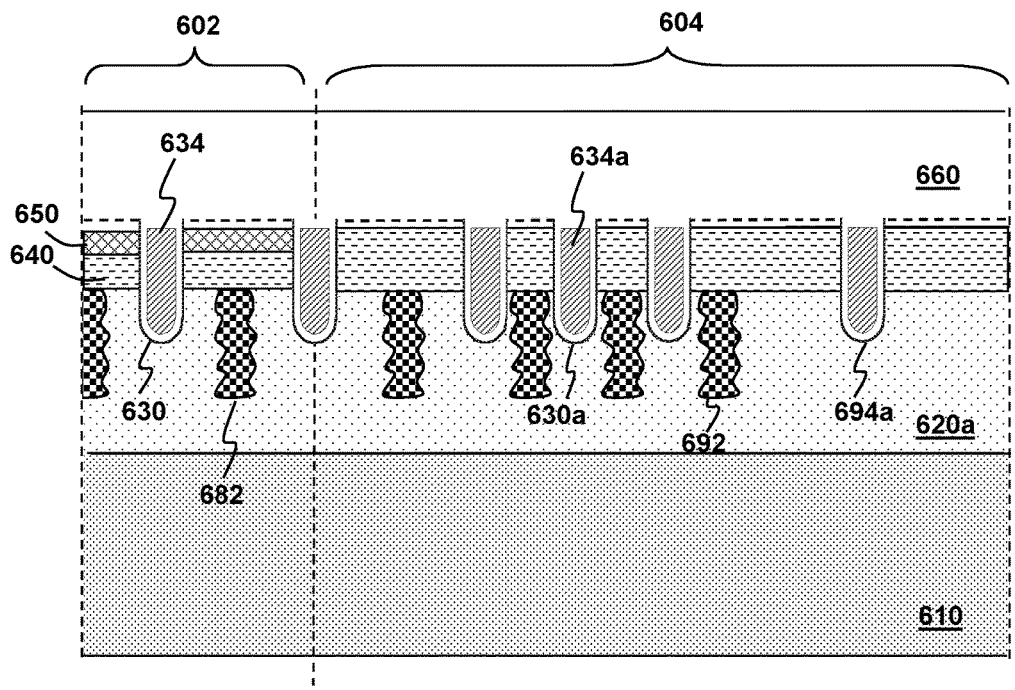

Subsequently, a planarized dielectric layer 660 is deposited over the doped epitaxial layer 620a in the active cell region 602 and in the termination region 604 as shown in FIG. 6H. In some embodiments, the dielectric layer 660 is formed by a low temperature oxide deposition process with material of Borophosphorosilicate Glass (BPSG).

Figure 6I:
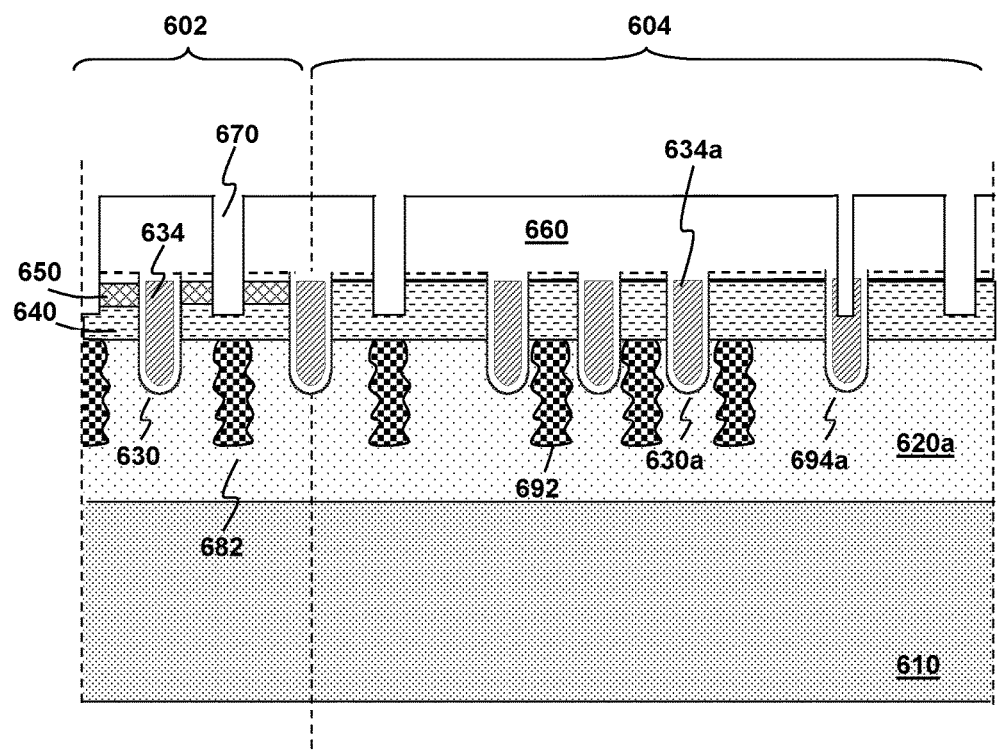

A contact photoresist (not shown) is then applied on the dielectric layer 660 with a pattern that has an opening at the locations of contact trenches. An etch process is performed to remove the uncovered portions of the dielectric layer 660 and form contact trenches 670 through the source region 650 into the body region 640 as shown in FIG. 6I. A conventional metallization process is then performed (not shown) to complete fabrication of the superjunction trench MOSFET device.

In some implementations, a trench channel stop may be used in the termination. The channel stop may include a last (i.e., outermost) trench and a trench contact. A metal layer may connect the outside trench contact and the polysilicon in the last trench.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶6.

What is claimed is:

1. A trench metal-oxide-semiconductor field-effect transistor (MOSFET) device having an operating voltage less than 500 V, comprising:
   an active cell region comprising a plurality of superjunction MOSFETs, wherein each superjunction MOSFET comprises:
   a) a lightly doped semiconductor epitaxial layer of a first conductivity type provided over a heavily doped semiconductor substrate of the first conductivity type;
   b) a body region of a second conductivity type opposite to the first conductivity type formed in upper portions of the lightly doped semiconductor epitaxial layer;
   c) a gate electrode formed in a gate trench extending into the body region and the lightly doped semiconductor epitaxial layer, wherein the gate trench has a pitch size less than 8 microns;
   d) a heavily doped source region of the first conductivity type formed in upper portions of the body region;

e) a source contact providing in a source contact trench extending to the body region between two adjacent gate trenches; and f) a doped column of the second conductivity type formed near a bottom of each source contact trench, wherein the doped column of the second conductivity type extends in the lightly doped semiconductor epitaxial layer of the first conductivity type without reaching an interface between the lightly doped semiconductor epitaxial layer of the first conductivity type and the heavily doped semiconductor substrate; and a termination region disposed at an outer periphery of the active cell region, the termination region comprising a termination structure surrounding the active cell region, wherein the termination structure comprises one or more guard rings formed in an intrinsic semiconductor epitaxial layer over the heavily doped semiconductor substrate.

2. The device of claim 1, wherein the active cell region comprises an array of gate trenches and an array of doped columns, wherein the array of the doped columns is arranged perpendicular to the array of the gate trenches, wherein the array of gate trenches includes the gate trench of each superjunction MOSFET of the plurality of superjunction MOSFETs and wherein the array of doped columns includes the doped column of each superjunction MOSFET of the plurality of superjunction MOSFETs.

3. The device of claim 2, wherein the doped columns has a pitch size different from the pitch size of the gate trench.

4. The device of claim 1, wherein the one or more guard rings includes a first type guard ring and a second type guard ring, wherein the first type guard ring is electrically connected with the source region and the second type guard ring has floating voltage in the termination region.

5. The device of claim 1, wherein the plurality of superjunction MOSFETs are single poly MOSFETs.

6. The device of claim 1, wherein the plurality of superjunction MOSFETs are shielded gate trench MOSFETs.

7. The device of claim 1, wherein an operating voltage of the device is between 8 V to 40 V.

8. The device of claim 1, wherein the pitch size of the gate trench is between 1 to 2 microns.

9. A trench metal-oxide-semiconductor field-effect transistor (MOSFET) device having an operating voltage less than 500 V, comprising:
an active cell region comprising a plurality of superjunction MOSFETs, wherein each superjunction MOSFET comprises:
a) a lightly doped semiconductor epitaxial layer of a first conductivity type provided over a heavily doped semiconductor substrate of the first conductivity type;
b) a body region of a second conductivity type opposite to the first conductivity type formed in upper portions of the lightly doped semiconductor epitaxial layer;
c) a gate electrode formed in a gate trench extending into the body region and the lightly doped semiconductor epitaxial layer, wherein the gate trench has a pitch size less than 8 microns;
d) a heavily doped source region of the first conductivity type formed in upper portions of the body region;
e) a source contact providing in a source contact trench extending to the body region between two adjacent gate trenches; and f) a doped column of the second conductivity type formed near a bottom of each source contact trench, wherein the doped column of the second conductivity type extends in the lightly doped semiconductor epitaxial layer of the first conductivity type without reaching an interface between the lightly doped semiconductor epitaxial layer of the first conductivity type and the heavily doped semiconductor substrate; and a termination region disposed at an outer periphery of the active cell region, the termination region comprising a termination structure surrounding the active cell region, wherein the termination structure comprises an array of floating doped columns of the second conductivity type formed in the lightly doped semiconductor epitaxial layer.

10. The device of claim 9, wherein the floating doped columns has a pitch size different from a pitch size of the doped columns in the active cell region.

11. The device of claim 9, wherein the termination structure further comprises floating termination trenches, each floating termination trench is provided between two adjacent floating doped columns.

12. The device of claim 11 wherein the floating termination trenches has a pitch size different from the pitch size of the gate trench in the active cell region.

13. The device of claim 9, wherein the active cell region comprises an array of gate trenches and an array of doped columns, wherein the array of the doped columns is arranged perpendicular to the array of the gate trenches, wherein the array of gate trenches includes the gate trench of each superjunction MOSFET of the plurality of superjunction MOSFETs and wherein the array of doped columns includes the doped column of each superjunction MOSFET of the plurality of superjunction MOSFETs.

14. The device of claim 13, wherein the doped columns has a pitch size different from the pitch size of the gate trench.

15. The device of claim 9, wherein the plurality of superjunction MOSFETs are single poly MOSFETs.

16. The device of claim 9, wherein the plurality of superjunction MOSFETs are shielded gate trench MOSFETs.

17. The device of claim 9, wherein the operating voltage of the device is between 8 V to 40 V.

18. The device of claim 9, wherein the pitch size of the gate trench is between 1 to 2 microns.

19. A method for manufacturing a trench MOSFET device, comprising:
a) forming an intrinsic semiconductor epitaxial layer of a first conductivity type over a heavily doped semiconductor substrate of the first conductivity type;
b) applying a gate trench mask to form a plurality of gate trenches in the intrinsic semiconductor epitaxial layer in an active cell region where device cells are located, wherein the gate trench mask includes openings to define location of the plurality of gate trenches, wherein each of the plurality of gate trenches has a pitch less than 8 microns;
c) forming a body region of a second conductivity type in upper portions of the intrinsic semiconductor epitaxial layer by applying a body mask which covers a termination region disposed at an outer periphery of the active cell region;
d) implanting dopants of the first conductivity type to form a doped semiconductor epitaxial layer in the active cell region by applying an implant block mask which covers the termination region;

e) forming a source region of the first conductivity in upper portions of the body region;

f) forming columns of the second conductivity type in the active cell region, wherein each of the columns of the second conductivity type formed between every two adjacent of the plurality of the gate trenches, wherein each of the columns of the second conductivity type extend in the doped semiconductor epitaxial layer of the first conductivity type without reaching an interface between the doped semiconductor epitaxial layer of the first conductivity type and the heavily doped semiconductor substrate;

g) forming a termination structure in the intrinsic semiconductor epitaxial layer in the termination region, wherein the termination structure includes one or more guard rings.

20. The method of claim 19, wherein the implanting dopants of the first conductivity uses ion energy less than 2.4 MeV for a 25 V device.

21. The method of claim 19, wherein the doped semiconductor epitaxial layer in the active cell region has a doping concentration ranging from about $1e17/cm^3$ to about $2e17/cm^3$.

22. The method of claim 19, wherein forming the columns of the second conductivity type in the active cell region is performed after steps for forming a body region and forming a source region.

23. The method of claim 19, wherein forming the columns of the second conductivity type in the active cell region is by a self-aligned multiple ion implantation process.

24. The method of claim 19, wherein an array of the columns of the second conductivity type in the active cell region is arranged perpendicular to an array of the plurality of gate trenches.

25. A method for manufacturing a trench MOSFET device, comprising:

a) forming an intrinsic semiconductor epitaxial layer of a first conductivity type over a heavily doped semiconductor substrate of the first conductivity type;

b) applying a gate trench mask to form a plurality of gate trenches in the intrinsic semiconductor epitaxial layer in an active cell region where device cells are located, wherein the gate trench mask includes openings to define location of the plurality of gate trenches, wherein each of the plurality of gate trenches has a pitch less than 8 microns;

c) forming a body region of a second conductivity type in upper portions of the intrinsic semiconductor epitaxial layer in the active cell region by applying a body mask which covers a termination region disposed at an outer periphery of the active cell region;

d) implanting dopants of the first conductivity type to form a doped semiconductor epitaxial layer in the active cell region and in the termination region;

e) forming a source region of the first conductivity in upper portions of the body region in the active cell region;

f) forming columns of the second conductivity type in the active cell region and termination columns of the second conductivity type in the termination region, wherein each of the columns of the second conductivity type extend in the doped semiconductor epitaxial layer of the first conductivity type without reaching an interface between the doped semiconductor epitaxial layer of the first conductivity type and the heavily doped semiconductor substrate, wherein each of the columns of the second conductivity type is formed between every two adjacent of the plurality of the gate trenches in the active cell region.

26. The method of claim 25, wherein a pitch size for the columns of the second conductivity type in the active cell region is different from a pitch size for the termination columns in the termination region.

27. The method of claim 25, wherein an array of the columns of the second conductivity type in the active cell region is arranged perpendicular to an array of the plurality of gate trenches.

28. A method for manufacturing a trench MOSFET device, comprising:

a) forming an intrinsic semiconductor epitaxial layer of a first conductivity type over a heavily doped semiconductor substrate of the first conductivity type;

b) applying a trench mask to form a plurality of trenches in the intrinsic semiconductor epitaxial layer; wherein the plurality of trenches includes a plurality of gate trenches in an active cell region where device cells are located and a plurality of floating termination trenches in a termination region disposed at an outer periphery of the active cell region, wherein the trench mask includes openings to define location of the plurality of trenches, wherein each of the plurality of trenches has a pitch less than 4 microns;

c) forming a body region of a second conductivity type in upper portions of the intrinsic semiconductor epitaxial layer in the active cell region by applying a body mask which covers the termination region;

d) implanting dopants of the first conductivity type to form a doped semiconductor epitaxial layer in the active cell region and in the termination region;

e) forming a source region of the first conductivity in upper portions of the body region in the active cell region; and f) forming columns of the second conductivity type in the active cell region and termination columns of the second conductivity type in the termination region, wherein each of the columns of the second conductivity type extend in the doped semiconductor epitaxial layer of the first conductivity type without reaching an interface between the doped semiconductor epitaxial layer of the first conductivity type and the heavily doped semiconductor substrate, wherein each of the columns of the second conductivity type is formed between every two adjacent of the plurality of the gate trenches in the active cell region and each of the termination columns of the second conductivity type is formed between every two adjacent of the plurality of the floating termination trenches in the termination region.

29. The method of claim 28, wherein a pitch size for the columns of the second conductivity type in the active cell region is different from a pitch size for the termination columns in the termination region.

30. The method of claim 28, wherein a pitch size for the plurality of gate trenches in an active cell region is different from a pitch size for the plurality of floating termination trenches in a termination region.

31. The method of claim 28, wherein an array of the columns of the second conductivity type in the active cell region is arranged perpendicular to an array of the plurality of gate trenches.

* * * * *